United States Patent
Matsuura et al.

(10) Patent No.: US 7,817,725 B2
(45) Date of Patent: Oct. 19, 2010

(54) DATA CONVERTER DEVICE AND DATA CONVERSION METHOD, AND TRANSMITTER CIRCUIT, COMMUNICATIONS DEVICE AND ELECTRONIC DEVICE USING THE SAME

(75) Inventors: Toru Matsuura, Sakai (JP); Hisashi Adachi, Mino (JP)

(73) Assignee: Panasonic Corporation, Osaka (JP)

( * ) Notice: Subject to any disclaimer, the term of this patent is extended or adjusted under 35 U.S.C. 154(b) by 1284 days.

(21) Appl. No.: 11/074,677

(22) Filed: Mar. 9, 2005

(65) Prior Publication Data
US 2005/0202790 A1 Sep. 15, 2005

(30) Foreign Application Priority Data
Mar. 10, 2004 (JP) .............................. 2004-068067

(51) Int. Cl.
H04B 14/06 (2006.01)
(52) U.S. Cl. ...................................... 375/245; 375/247
(58) Field of Classification Search ................ 375/242, 375/243, 244, 245, 247, 254, 295, 296, 298, 375/300, 302; 704/200, 201, 221, 222; 341/126, 341/143, 50, 76, 77; 708/300
See application file for complete search history.

(56) References Cited

U.S. PATENT DOCUMENTS

| | | | | |
|---|---|---|---|---|
| 4,390,756 A | * | 6/1983 | Hoffmann et al. | 607/56 |
| 4,775,851 A | * | 10/1988 | Borth | 341/155 |
| 5,959,562 A | * | 9/1999 | Wiesbauer | 341/143 |
| 6,057,792 A | * | 5/2000 | Eastty et al. | 341/143 |

(Continued)

FOREIGN PATENT DOCUMENTS

CN       1469552       1/2004

(Continued)

OTHER PUBLICATIONS

Bruce A. Wooley, Institute of Electrical and Electronics Engineers: "Cascaded Noise-Shaping Modulators for Oversampled Data Conversion," Proceedings of the IEEE 2003 Custom Integrated Circuits Conference. (CICC 2003). San Jose, CA, Sep. 21-24, 2003, IEEE Custom Integrated Circuits Conference.CICC, New York, NY : IEEE, US, vol. CONF. 25, pp. 113 and 114 XP010671160.

*Primary Examiner*—David C Payne
*Assistant Examiner*—Vineeta S Panwalkar
(74) *Attorney, Agent, or Firm*—Wenderoth, Lind & Ponack, LLP

(57) ABSTRACT

The present invention aims to provide a transmitter circuit that is capable of suppressing quantization noise and operating with a high efficiency, a data converter section 13 and a data conversion method for use therein, and a communications device using the same. The data converter section 13 of the present invention performs a predetermined data conversion operation on an input signal. The data converter section 13 includes: a signal processing section 133 for discretizing the input signal to produce a signal having a lower resolution magnitude-wise than that of the input signal; a subtractor section 134 for subtracting the input signal from the signal having a lower resolution to extract quantization noise; a filter 135 for extracting quantization noise near an intended wave frequency; and a subtractor section 136 for removing the quantization noise near the intended wave frequency from the signal having a lower resolution.

26 Claims, 20 Drawing Sheets

U.S. PATENT DOCUMENTS

| | | |
|---|---|---|
| 6,289,245 B1 * | 9/2001 | Mo et al. .................. 607/41 |
| 6,784,817 B2 | 8/2004 | Matsuura et al. |
| 7,072,429 B1 * | 7/2006 | Sogo ..................... 375/350 |
| 2002/0168019 A1 * | 11/2002 | Bengtsson et al. .......... 375/295 |
| 2003/0123566 A1 * | 7/2003 | Hasson .................... 375/279 |

FOREIGN PATENT DOCUMENTS

| | | |
|---|---|---|
| EP | 0 726 656 | 8/1996 |
| GB | 2 266 017 | 10/1993 |
| JP | 2002-325109 | 11/2002 |
| JP | 2003-229769 | 8/2003 |
| JP | 2004-72734 | 3/2004 |
| JP | 2004-72735 | 3/2004 |

\* cited by examiner

US 7,817,725 B2

DATA CONVERTER DEVICE AND DATA CONVERSION METHOD, AND TRANSMITTER CIRCUIT, COMMUNICATIONS DEVICE AND ELECTRONIC DEVICE USING THE SAME

BACKGROUND OF THE INVENTION

1. Field of the Invention

The present invention relates to a transmitter circuit in a communications device such as a mobile telephone or a wireless LAN device and an electronic device such as an audio device or a video device, and to a data converter section and a data conversion method for use therein. More particularly, the present invention relates to a transmitter circuit, a communications device and an electronic device that are capable of suppressing quantization noise, small in size and capable of operating with a high efficiency, and to a data converter and a data conversion method for use therein.

2. Description of the Background Art

A communications device provided on the terminal side of a mobile communications system, such as a mobile telephone or a wireless LAN device, is expected to operate with a low power consumption while ensuring the linearity in the output signal over a wide power amplification range. Accordingly, there is a demand for such a communications device to have a transmitter circuit capable of ensuring the linearity in the output signal while being capable of power amplification of the output signal with a low power consumption.

FIG. 33 is a block diagram showing an exemplary configuration of a conventional communications device. Referring to FIG. 33, the conventional communications device includes a transmitter circuit 900, a receiver circuit 951, an antenna duplexer 952 and an antenna 953. A high-frequency signal to be transmitted is produced at the transmitter circuit 900, and is radiated into the air from the antenna 953 via the antenna duplexer 952. A high-frequency signal received by the antenna 953 is passed to the receiver circuit 951 via the antenna duplexer 952, and the received signal is processed. The antenna duplexer 952 may be a duplexer using, for example, a switch, a dielectric, a SAW (Surface Acoustic Wave) filter, an FBAR (Film Bulk Acoustic Resonator) filter, etc.

An example of the transmitter circuit 900 used in a conventional communications device is a transmitter circuit disclosed in Japanese Laid-Open Patent Publication No. 2002-325109. FIG. 34 is a block diagram showing an exemplary configuration of the conventional transmitter circuit 900. The transmitter circuit 900 shown in FIG. 34 will be hereinafter referred to as a first conventional transmitter circuit. Referring to FIG. 34, the first conventional transmitter circuit includes a data production section 901, an output terminal 902, a delta-sigma modulator 903, an angle modulator section 904, a voltage controller section 905, an amplitude modulator section 906 and a bandpass filter 907.

The data production section 901 produces amplitude data and phase data as data to be transmitted. The amplitude data is inputted to the delta-sigma modulator 903. The delta-sigma modulator 903 delta-sigma-modulates the received amplitude data to output delta-sigma-modulated data. The delta-sigma-modulated data is inputted to the voltage controller section 905. The voltage controller section 905 supplies, to the amplitude modulator section 906, a voltage that is controlled according to the delta-sigma-modulated data.

The phase data is inputted to the angle modulator section 904. The angle modulator section 904 angle-modulates the received phase data to output an angle-modulated wave signal. The amplitude modulator section 906 amplitude-modulates the angle-modulated wave signal with the voltage supplied from the voltage controller section 905 to produce a modulated wave signal. The modulated wave signal produced by the amplitude modulator section 906 is inputted to the bandpass filter 907. The bandpass filter 907 removes out-of-band, unnecessary portions from the modulated wave signal produced by the amplitude modulator section 906. The modulated wave signal whose unnecessary components have been removed through the bandpass filter 907 is outputted via the terminal 902.

In a case where amplitude data is delta-sigma-modulated into two values of zero and a real number, for example, the delta-sigma modulator 903 outputs delta-sigma-modulated data that is discretized into two values of zero and a real number. Thus, the delta-sigma-modulated data, which has only two states (i.e., ON and OFF) with a constant ON-state level, is a signal that is unlikely to be influenced by the non-linearity of the amplitude modulator section 906. Therefore, the first conventional transmitter circuit can output a transmitted signal with little distortion.

Another example of the transmitter circuit 900 used in a conventional communications device is a transmitter circuit disclosed in Japanese Laid-Open Patent Publication No. 2004-072734. FIG. 35 is a block diagram showing an exemplary configuration of the conventional transmitter circuit 900. The transmitter circuit 900 shown in FIG. 35 will be hereinafter referred to as a second conventional transmitter circuit. Referring to FIG. 35, the second conventional transmitter circuit includes an input terminal 911, a data converter section 912, an amplifier 913, a bandpass filter 914 and an output terminal 915.

The data converter section 912 performs a predetermined data conversion operation on an input signal received via the input terminal 911 to output a signal having a smaller resolution magnitude-wise than that of the input signal. Specifically, the data converter section 912 delta-sigma-modulates amplitude data, which is the amplitude component contained in the input signal, and multiplies the delta-sigma-modulated amplitude data with phase data, which is the phase component contained in the input signal, to produce the signal having a lower resolution than that of the input signal. The amplifier 913 amplifies the output signal from the data converter section 912, and outputs the amplified signal to the bandpass filter 914. The bandpass filter 914 removes quantization noise introduced by the delta-sigma-modulation from the signal amplified through the amplifier 913. The signal from which the quantization noise has been removed is outputted via the output terminal 915.

However, the first and second conventional transmitter circuits have a problem as will be described later. The problem will now be described with respect to the first conventional transmitter circuit (see FIG. 34). In the first conventional transmitter circuit, the modulated wave signal outputted from the amplitude modulator section 906 contains quantization noise introduced by the delta-sigma-modulation at frequencies relatively near the intended wave frequency. FIG. 36 shows an exemplary waveform of the modulated wave signal outputted from the amplitude modulator section 906. In FIG. 36, the frequency along the horizontal axis represents the frequency shift with respect to the center frequency (intended wave frequency) of the modulated wave signal. As can be seen from FIG. 36, the modulated wave signal contains a high level of quantization noise at frequencies relatively near the intended wave frequency. Therefore, the bandpass filter 907 for removing quantization noise desirably has steep attenuation characteristics. With the bandpass filter 907 having such characteristics, it is difficult to reduce the signal loss therethrough or to reduce the physical size thereof.

Moreover, when the transmitter circuit changes the transmission frequency band, the bandpass filter 907 having steep attenuation characteristics needs to frequently switch the band of a signal to be passed therethrough (the pass band) from one to another. FIG. 37 shows exemplary characteristics required for the bandpass filter 907 used in the conventional transmitter circuit. Referring to FIG. 37, the bandpass filter 907 switches the pass band from one to another among pass bands A to D each time the transmitter circuit changes the transmission frequency band. In order to realize characteristics as shown in FIG. 37, the bandpass filter 907 needs to be provided with a variable-capacitance device such as a varactor, for example. However, the bandpass filter 907 has a problem that the varactor may cause a loss or an increase in the circuit scale.

In order to reduce the quantization noise introduced by the delta-sigma-modulation in the conventional transmitter circuit without requiring steep attenuation characteristics for the bandpass filter 907, it is then necessary to, for example, increase the clock frequency of the delta-sigma modulator 903. However, the delta-sigma modulator 903 has a problem that an increase in the clock frequency may cause an increase in the power consumption and an increase in the circuit scale. Thus, the first and second conventional transmitter circuits have a problem that it is necessary to use the bandpass filter 907 having steep attenuation characteristics, the delta-sigma modulator 903 operating at a high clock frequency, etc., whereby it is difficult to reduce the circuit scale and the power consumption.

Another example of the conventional transmitter circuit 900 that solves these problems is a transmitter circuit disclosed in Japanese Laid-Open Patent Publication No. 2004-072735. FIG. 38 is a block diagram showing an exemplary configuration of the conventional transmitter circuit 900. The transmitter circuit 900 shown in FIG. 38 will be hereinafter referred to as a third conventional transmitter circuit. Referring to FIG. 38, the third conventional transmitter circuit includes an input terminal 921, a signal processing section 922, a first signal source 923, a second signal source 924, a main amplifier 925, an auxiliary amplifier 926, a synthesizer 927 and an output terminal 928.

Based on a signal X0 inputted via the input terminal 921, the signal processing section 922 produces a signal X1 to be outputted to the first signal source 923 and a signal X2 to be outputted to the second signal source 924. The signal X1 to be outputted to the first signal source 923 is obtained by delta-sigma-modulating the input signal X0. The signal X2 to be outputted to the second signal source 924 is obtained by removing the input signal X0 from the signal X1 to be outputted to the first signal source 923.

The first signal source 923 produces an analog signal taking two or more discrete values, and outputs the produced signal to the main amplifier 925. For example, the output signal from the first signal source 923 is a two-valued analog signal obtained by delta-sigma-modulating the input signal X1 inputted to the first signal source 923, and is a signal containing a component of the input signal X1 inputted to the first signal source 923 and quantization noise components introduced by the delta-sigma-modulation. The second signal source 924 outputs a signal equivalent to the quantization noise components of the output signal from the first signal source 923.

The main amplifier 925 amplifies the signal outputted from the first signal source 923, and outputs the amplified signal to the synthesizer 927. The auxiliary amplifier 926 amplifies the output signal from the second signal source 924, and outputs the amplified signal to the synthesizer 927. Based on the output signals from the main amplifier 925 and the auxiliary amplifier 926, the synthesizer 927 removes the quantization noise from the output signal of the first signal source 923. Specifically, the synthesizer 927 makes an adjustment so that the quantization noise contained in the output signal from the first signal source 923 and the output signal from the second signal source 924 (i.e., quantization noise) are equi-amplitude anti-phase signals, and synthesizes these signals together, thus removing the quantization noise from the output signal of the first signal source 923. The synthesized signal from the synthesizer 927 is outputted via the output terminal 928. Thus, the third conventional transmitter circuit can suppress quantization noise without using a bandpass filter having steep attenuation characteristics, a delta-sigma modulator operating at a high clock frequency, or the like.

However, in the third conventional transmitter circuit (see FIG. 38), the signal delta-sigma-modulated through the first signal source 923 (i.e., a signal containing an intended wave signal and quantization noise) and the signal produced by the second signal source 924 (i.e., quantization noise) are separately amplified and then synthesized together on an analog basis through the synthesizer 927 to remove the quantization noise. Therefore, the third conventional transmitter circuit has long signal paths before the synthesizer 927 where the two signals are synthesized together, and has many analog components. Thus, a troublesome control is required for ensuring a match between the levels, phases and delays of the signals traveling along these paths, and it is difficult to sufficiently reduce the circuit scale and the power consumption.

SUMMARY OF THE INVENTION

Therefore, an object of the present invention is to provide a transmitter circuit, a communications device and an electronic device that are capable of suppressing quantization noise without requiring a troublesome control, small in size and capable of operating with a high efficiency, and to provide a data converter and a data conversion method for use therein.

The present invention is directed to a data converter device for performing a predetermined data conversion operation on a received signal. In order to achieve the object set forth above, the data converter device of the present invention includes a first operational section, a second operational section, a third operational section and a fourth operational section.

The first operational section discretizes the received signal to produce a signal having a lower resolution magnitude-wise than that of the received signal. The second operational section extracts, from the signal having a lower resolution produced by the first operational section, quantization noise components generated in the first operational section. The third operational section extracts, from the quantization noise components extracted by the second operational section, quantization noise components near an intended wave frequency being a center frequency. The fourth operational section for outputs, based on the signal having a lower resolution produced by the first operational section and the quantization noise components near the intended wave frequency extracted by the third operational section, a signal obtained by removing the quantization noise components near the intended wave frequency from the signal having a lower resolution magnitude-wise than that of the received signal.

In another data converter device of the present invention, the first operational section includes a signal processing section for discretizing the received signal to produce a signal having a lower resolution magnitude-wise than that of the received signal; the second operational section includes a first subtractor section for subtracting the received signal from the signal having a lower resolution produced by the signal processing section to extract quantization noise components generated in the signal processing section; the third operational section includes a filter for rejecting the quantization noise components extracted by the first subtractor section with a predetermined cutoff frequency to extract quantization noise components near the intended wave frequency being the center frequency of the received signal; and the fourth operational section includes a second subtractor section for subtracting the quantization noise components near the intended wave frequency extracted by the filter from the signal having a lower resolution produced by the signal processing section to output a signal obtained by removing the quantization noise components near the intended wave frequency from the signal having a lower resolution magnitude-wise than that of the received signal.

Preferably, where the received signal is quadrature data, the signal processing section includes: a coordinate converter section for producing amplitude data representing a magnitude of the quadrature data and dividing the quadrature data by the amplitude data to produce phase data, thereby performing a coordinate conversion operation converting the quadrature data to the amplitude data and the phase data; a delta-sigma modulator for delta-sigma-modulating the amplitude data into two or more values, thereby lowering a resolution of the amplitude data; and a multiplier section for multiplying the amplitude data delta-sigma-modulated by the delta-sigma modulator with the phase data to output a signal having a lower resolution magnitude-wise than that of the quadrature data.

Alternatively, where the received signal is quadrature data, the signal processing section includes: at least one subtractor section receiving the quadrature data; at least one vector integrator section connected to the subtractor section for integrating together elements of the quadrature data; and a vector quantizer section for quantizing the quadrature data, which has been integrated by the vector integrator section, so that a magnitude of the integrated quadrature data is equal to a maximum discrete value among at least two discrete values that is smaller than a magnitude of the received quadrature data and so that a phase of the integrated quadrature data is equal to that of the received quadrature data, thereby outputting a signal having a lower resolution magnitude-wise than that of the received quadrature data; and the subtractor section subtracts the quadrature data, which has been obtained through quantization by the vector quantizer section, from the received quadrature data.

In another embodiment of the present invention, where the received signal is a modulated wave signal obtained through a modulation operation based on quadrature data, the signal processing section includes a delta-sigma modulator for delta-sigma-modulating the modulated wave signal into two or more values to output a signal having a lower resolution magnitude-wise than that of the modulated wave signal.

For example, in a case where the zero point of the noise transfer function in the signal processing section is 1, the filter included in the data converter device is a low-pass filter.

For example, in a case where the zero point of the noise transfer function in the signal processing section is a complex number whose magnitude is 1, the filter included in the data converter device is a bandpass filter.

Preferably, the cutoff frequency of the filter included in the data converter device is smaller than ½ a sampling frequency in the signal processing section if the filter is a low-pass filter.

If the filter is a bandpass filter, the cutoff frequency of the filter included in the data converter device is preferably larger than the center frequency of the received signal minus ½ the sampling frequency and smaller than the center frequency of the received signal plus ½ the sampling frequency.

The present invention is also directed to a transmitter circuit for performing a predetermined operation on an input signal to output a signal to be transmitted. In order to achieve the object set forth above, the transmitter circuit of the present invention includes a data converter section, a modulator/amplifier section and a bandpass filter.

The data converter section receives a whole or a part of the input signal and performing a predetermined data conversion operation on the received signal. The modulator/amplifier section performs at least one of a modulation operation and an amplification operation based on the signal converted by the data converter section. The bandpass filter removes out-of-band, unnecessary components from the signal, which has undergone at least one of the modulation operation and the amplification operation by the modulator/amplifier section, with a predetermined cutoff frequency to output the signal to be transmitted. More specifically, the data converter section includes a signal processing section, a first subtractor section, a filter and a second subtractor section.

The signal processing section discretizes the received signal to produce a signal having a lower resolution magnitude-wise than that of the received signal. The first subtractor section subtracts the received signal from the signal having a lower resolution produced by the signal processing section to extract quantization noise components generated in the signal processing section. The filter rejects the quantization noise components extracted by the first subtractor section with a predetermined cutoff frequency to extract quantization noise components near an intended wave frequency being a center frequency of the received signal. The second subtractor section subtracts the quantization noise components near the intended wave frequency extracted by the filter from the signal having a lower resolution produced by the signal processing section to output a signal obtained by removing the quantization noise components near the intended wave frequency from the signal having a lower resolution magnitude-wise than that of the received signal.

Where the input signal is quadrature data, the data converter section receives quadrature data, and the modulator/amplifier section includes: a vector modulator section for modulating a signal converted by the data converter section; and an amplifier section for amplifying the signal modulated by the vector modulator section to a predetermined output level.

For example, the vector modulator section may modulate the signal converted by the data converter section through a quadrature modulation operation.

In another embodiment of the present invention, where the input signal is quadrature data, the data converter section receives quadrature data. Then, the modulator/amplifier section includes: a polar coordinate system converter section for converting the signal converted by the data converter section to polar coordinate data to output amplitude data and phase data; an angle modulator section for angle-modulating the phase data to output an angle-modulated wave signal; an amplitude modulator section for amplitude-modulating the angle-modulated wave signal with a voltage according to a magnitude of the amplitude data; and a voltage controller section for controlling the voltage supplied to the amplitude modulator section according to the magnitude of the amplitude data.

In another embodiment of the present invention, where the input signal is a modulated wave signal obtained through a modulation operation based on quadrature data, the data converter section receives the modulated wave signal. Then, the modulator/amplifier section includes an amplifier section for amplifying the signal converted by the data converter section to a predetermined output level.

In another embodiment of the present invention, where the input signal is polar coordinate data including amplitude data and phase data, the data converter section receives the amplitude data. Then, the modulator/amplifier section includes: an angle modulator section for angle-modulating the phase data to output an angle-modulated wave signal; an amplitude modulator section for amplitude-modulating the angle-modulated wave signal with a voltage according to a magnitude of a signal outputted from the data converter section; and a voltage controller section for controlling the voltage supplied to the amplitude modulator section according to the magnitude of the signal outputted from the data converter section.

In another embodiment of the present invention, the transmitter circuit of the present invention may include a data converter section and a modulator/amplifier section. The data converter section receives a whole or a part of the input signal and performing a predetermined data conversion operation on the received signal. The modulator/amplifier section performs at least one of a modulation operation and an amplification operation based on the signal converted by the data converter section to output a signal to be transmitted. More specifically, the data converter section receives a modulated wave signal or amplitude data, being scalar data. The data converter section includes a signal processing section, a first subtractor section, a filter and a second subtractor section.

The signal processing section discretizes the received signal to produce a signal having a lower resolution magnitude-wise than that of the received signal. The first subtractor section subtracts the received signal from the signal having a lower resolution produced by the signal processing section to extract quantization noise components generated in the signal processing section. The filter rejects the quantization noise components extracted by the first subtractor section with a predetermined cutoff frequency to extract quantization noise components near an intended wave frequency being a center frequency of the received signal. The second subtractor section subtracts the quantization noise components near the intended wave frequency extracted by the filter from the signal having a lower resolution produced by the signal processing section to output a signal obtained by removing the quantization noise components near the intended wave frequency from the signal having a lower resolution magnitude-wise than that of the received signal.

The transmitter circuit receives polar coordinate data including amplitude data and phase data. Then, the data converter section receives the amplitude data. The modulator/amplifier section includes: a voltage controller section for controlling an output voltage according to the signal converted by the data converter section; a low-pass filter for rejecting the voltage controlled by the voltage controller section with a predetermined cutoff frequency to remove out-of-band noise components; an angle modulator section for angle-modulating the phase data to output an angle-modulated wave signal; and an amplitude modulator section for amplitude-modulating the angle-modulated wave signal with the voltage outputted from the low-pass filter.

The signal processing section used in the data converter section receiving quadrature data includes: a coordinate converter section for producing amplitude data representing a magnitude of the quadrature data and dividing the quadrature data by the amplitude data to produce phase data, thereby performing a coordinate conversion operation converting the quadrature data to the amplitude data and the phase data; a delta-sigma modulator for delta-sigma-modulating the amplitude data into two or more values, thereby lowering a resolution of the amplitude data; and a multiplier section for multiplying the amplitude data delta-sigma-modulated by the delta-sigma modulator with the phase data to output a signal having a lower resolution magnitude-wise than that of the quadrature data.

The signal processing section used in the data converter section receiving quadrature data may alternatively include: at least one subtractor section receiving the quadrature data; at least one vector integrator section connected to the subtractor section for integrating together elements of the quadrature data; and a vector quantizer section for quantizing the quadrature data, which has been integrated by the vector integrator section, so that a magnitude of the integrated quadrature data is equal to a maximum discrete value among at least two discrete values that is smaller than a magnitude of the received quadrature data and so that a phase of the integrated quadrature data is equal to that of the received quadrature data, thereby outputting a signal having a lower resolution magnitude-wise than that of the received quadrature data; and the subtractor section subtracts the quadrature data, which has been obtained through quantization by the vector quantizer section, from the received quadrature data.

The signal processing section used in the data converter section receiving a modulated wave signal or amplitude data, being scalar data, includes a delta-sigma modulator for delta-sigma-modulating the received signal into two or more values to output a signal having a lower resolution magnitude-wise than that of the received signal.

For example, in a case where the zero point of the noise transfer function in the signal processing section is 1, the filter included in the data converter section is a low-pass filter.

For example, in a case where the zero point of the noise transfer function in the signal processing section is a complex number whose magnitude is 1, the filter included in the data converter section is a bandpass filter.

For example, where the pole of the delta-sigma modulator is a complex number whose magnitude is 1, the filter included in the data converter section is a bandpass filter.

Preferably, the cutoff frequency of the filter included in the data converter section is smaller than ½ a sampling frequency in the signal processing section if the filter is a low-pass filter. If the filter is a bandpass filter, the cutoff frequency of the filter included in the data converter section is preferably larger than the center frequency of the received signal minus ½ the sampling frequency and smaller than the center frequency of the received signal plus ½ the sampling frequency.

The present invention is also directed to a communications device and an electronic device. In order to achieve the object set forth above, a communications device of the present invention includes any transmitter circuit as set forth above, and an antenna for outputting the transmitted signal produced by the transmitter circuit.

An electronic device of the present invention includes: an amplifier; and a data converter section for converting an input signal to a signal to be inputted to the amplifier. The data converter section includes: a signal processing section for discretizing the input signal to produce a signal having a lower resolution magnitude-wise than that of the input signal; a first subtractor section for subtracting the input signal from the signal having a lower resolution produced by the signal processing section to extract quantization noise components generated in the signal processing section; a filter for rejecting the quantization noise components extracted by the first subtractor section with a predetermined cutoff frequency to extract quantization noise components near an intended wave frequency being a center frequency of the input signal; and a second subtractor section for subtracting the quantization noise components near the intended wave frequency extracted by the filter from the signal having a lower resolution produced by the signal processing section to output a signal obtained by removing the quantization noise components near the intended wave frequency from the signal having a lower resolution magnitude-wise than that of the received signal.

The present invention is also directed to a data conversion method for performing a predetermined data conversion operation on a received signal. In order to achieve the object set forth above, the data conversion method of the present invention includes: a first step of discretizing the received signal to produce a signal having a lower resolution magnitude-wise than that of the received signal; a second step of subtracting the received signal from the signal having a lower resolution produced in the first step to extract quantization noise components generated in first the step; a third step of rejecting the quantization noise components extracted in the second step with a predetermined cutoff frequency to extract quantization noise components near an intended wave frequency being a center frequency of the received signal; and a fourth step of subtracting the quantization noise components near the intended wave frequency extracted in the third step from the signal having a lower resolution produced in the first step to output a signal obtained by removing the quantization noise components near the intended wave frequency from the signal having a lower resolution magnitude-wise than that of the received signal.

As described above, the data converter section of the present invention quantizes the input signal, and then removes the quantization noise introduced by the quantization process from near the intended wave frequency. Therefore, the data converter section can output a signal in which the quantization noise is reduced near the intended wave frequency without requiring a troublesome control. Moreover, the data converter section does not need to increase the clock frequency or the order of the delta-sigma modulator to reduce the quantization noise near the intended wave frequency. Accordingly, the power consumption can be reduced.

Moreover, since the quantization noise near the intended wave frequency is reduced, the transmitter circuit of the present invention does not need to use a bandpass filter having steep attenuation characteristics. Therefore, it is possible to reduce the overall power consumption of the transmitter circuit. Moreover, even if the frequency band of the transmitted signal changes, it is not necessary to switch the pass band of the bandpass filter from one to another. Accordingly, the power consumption can be reduced, and the circuit scale can also be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
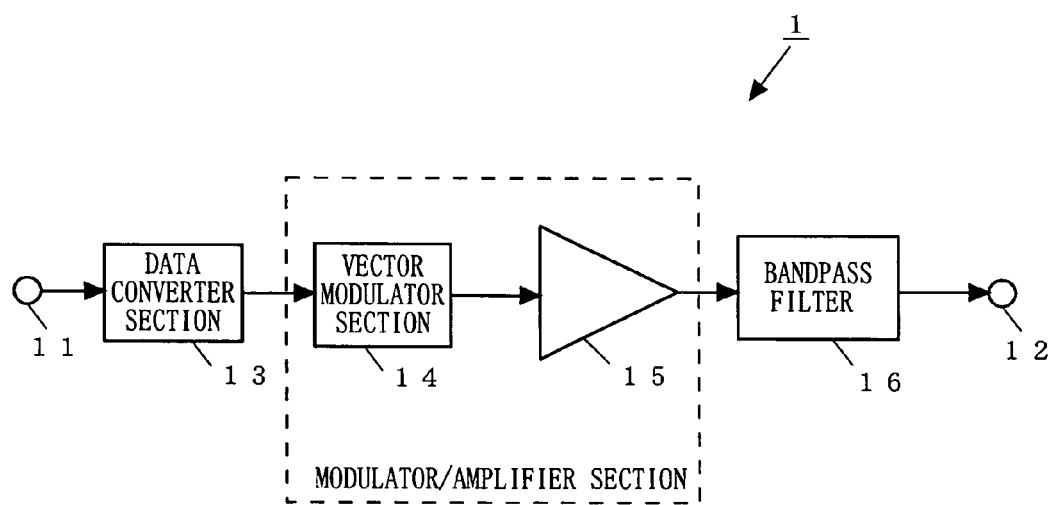
FIG. 1 is a block diagram showing an exemplary configuration of a transmitter circuit 1 according to a first embodiment of the present invention.

FIG. 1 is a block diagram showing an exemplary configuration of a transmitter circuit 1 according to a first embodiment of the present invention. Referring to FIG. 1, the transmitter circuit 1 includes an input terminal 11, an output terminal 12, a data converter section 13, a vector modulator section 14, an amplifier 15 and a bandpass filter 16.

The data converter section 13 performs a predetermined data conversion on the input signal. The vector modulator section 14 modulates the signal converted by the data converter section 13. The amplifier 15 amplifies the signal modulated by the vector modulator section 14. The bandpass filter 16 filters the signal amplified through the amplifier 15 by allowing only signal components within an intended frequency band to pass therethrough. The vector modulator section 14 and the amplifier 15 together form a modulator/amplifier section.

The operation of the transmitter circuit 1 will now be described.

The input terminal 11 receives a baseband signal as the input signal thereto. A baseband signal is a signal with which a carrier wave is modulated to obtain a modulated signal. As the baseband signal, the transmitter circuit 1 receives in-phase data I and quadrature-phase data Q orthogonal to each other. Hereinafter, data represented in a rectangular coordinate system, such as I and Q data, will be referred to as "quadrature data". Note that quadrature data being an input signal may be a multiple-bit digital signal (i.e., an already discretized signal) or an analog signal (i.e., an un-discretized signal).

The quadrature data is inputted to the data converter section 13 via the input terminal 11. The data converter section 13 converts the quadrature data (input signal) to a signal having a lower resolution than that of the input signal. Specifically, where the input signal is a discretized signal, the data converter section 13 converts the quadrature data (input signal) to a signal having a lower resolution than that of the input signal by increasing the interval between discrete values. Where the input signal is an un-discretized signal, the data converter section 13 converts the quadrature data (input signal) to a signal having a lower resolution than that of the input signal by discretizing the input signal. Thus, the term "to discretize" as used herein means both to increase the interval between discrete values of an already-discretized signal and to discretize an un-discretized signal.

In the data converter section 13, the process of discretizing the input signal introduces noise components called "quantization noise" having frequencies other than the intended wave frequency. Therefore, the data converter section 13 removes the quantization noise from near the intended wave frequency to output a signal in which the quantization noise is reduced near the intended wave frequency. The data converter section 13 will be described later along with a specific configuration thereof.

Figure 2:
FIG. 2 is a block diagram showing an exemplary waveform representing the magnitude of an output signal from a data converter section 13.

FIG. 2 shows an exemplary waveform representing the magnitude of the output signal from the data converter section 13 (the square root of the sum of squares of the output I and Q data). It is assumed that the data converter section 13 has discretized the input signal so that the input signal is divided into two regions (e.g., one region generally represented by zero and another region generally represented by a real number). Then, as shown in FIG. 2, the output signal from the data converter section 13 has a signal waveform as if the output were turned ON/OFF periodically. Thus, the data converter section 13 can output a signal that is not completely discretized magnitude-wise but has only two states (i.e., ON and OFF) with little fluctuations in the signal level in each state.

Figure 3:
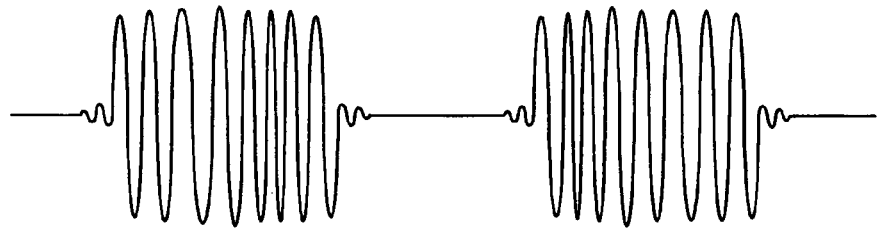
FIG. 3 shows an exemplary waveform of a signal outputted from a vector modulator section 14.

The output signal from the data converter section 13 is inputted to the vector modulator section 14. The vector modulator section 14 modulates the output signal from the data converter section 13 to output a modulated wave signal. FIG. 3 shows an exemplary waveform of an output signal from the vector modulator section 14. As shown in FIG. 3, the vector modulator section 14 is capable of outputting a signal whose envelope has little fluctuations in the ON state and in the OFF state. The vector modulator section 14 outputs a modulated wave signal by, for example, performing a quadrature modulation operation on the input signal.

In FIG. 2 and FIG. 3, the envelope of the signal waveform is not constant (completely straightened) because a portion of quantization noise has been removed in the data converter section 13.

Figure 4:
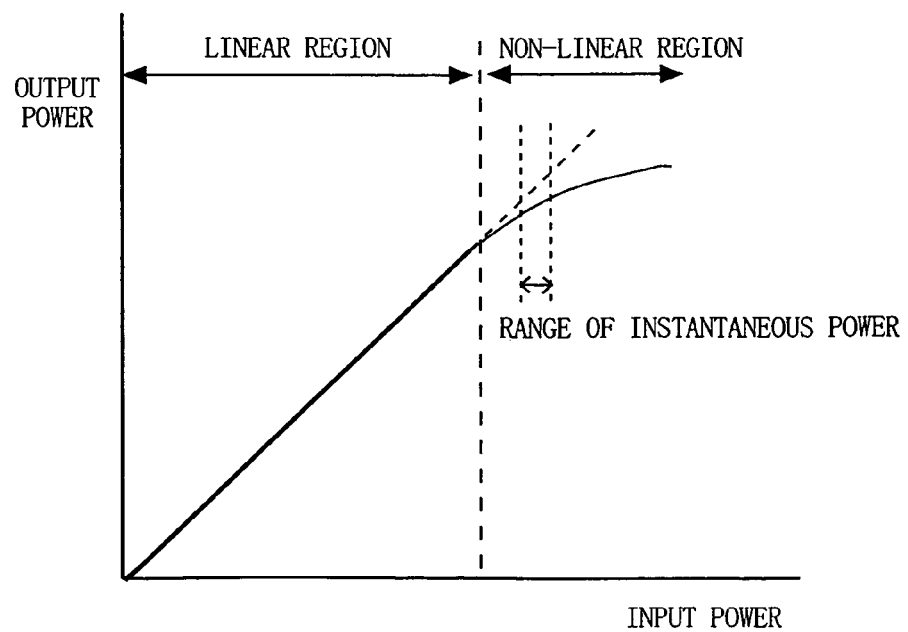
FIG. 4 shows characteristics of a typical amplifier.

The modulated wave signal from the vector modulator section 14 is inputted to the amplifier 15. The amplifier 15 amplifies the modulated wave signal to a required output level. FIG. 4 shows characteristics of a typical amplifier.

In FIG. 4, the range of instantaneous power of the amplifier 15 may be a small region because the range of envelope of the input signal (modulated wave signal) in the ON state has little fluctuations. A signal whose instantaneous power varies within a small range is less likely to be influenced by a distortion even in a non-linear region of the amplifier 15. Therefore, the amplifier 15 can output a signal with little distortion even in the non-linear region. Moreover, it can be seen from FIG. 4 that the amount of change in the output power in response to a change in the input power is small. This also shows that with the amplifier 15, there is little influence of a distortion in the output power due to a change in the input power.

The modulated wave signal amplified through the amplifier 15 is inputted to the bandpass filter 16. The bandpass filter 16 removes out-of-band, unnecessary noise components from the received modulated wave signal to output an intended modulated wave signal.

Figure 5:
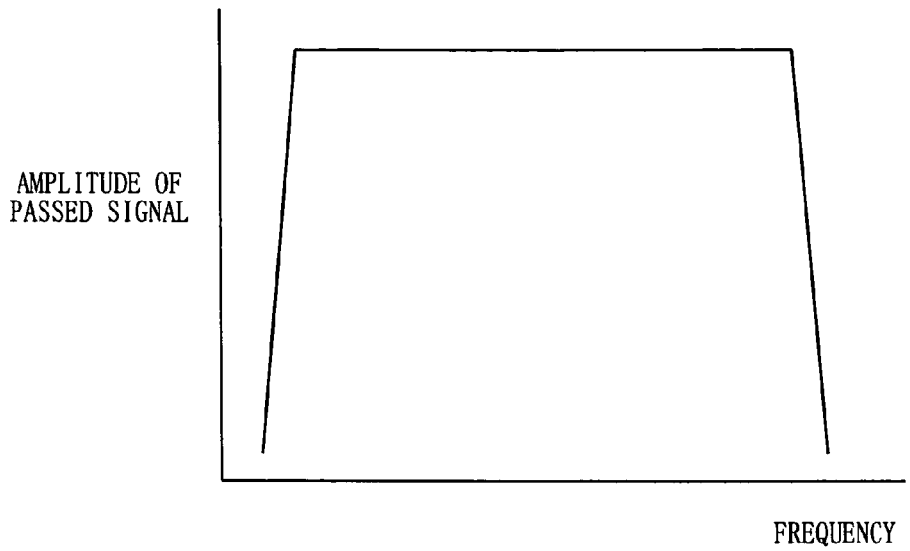
FIG. 5 shows exemplary characteristics required for a bandpass filter 16 in the transmitter circuit 1 according to the first embodiment of the present invention.

The bandpass filter 16 is not required to have steep attenuation characteristics because quantization noise near the intended wave frequency has already been removed by the data converter section 13. If the quantization noise within the transmission band has been sufficiently removed, the bandpass filter 16 may have a wide pass band so that it is not necessary to switch the pass band from one to another when the frequency of the transmitted signal changes. FIG. 5 shows exemplary characteristics required for the bandpass filter 16 in the transmitter circuit 1 according to the first embodiment of the present invention. For example, while the bandpass filter 907 of the conventional transmitter circuit shown in FIG. 30 switches the pass band from one to another among pass bands A to D, such pass band switching is not necessary with the bandpass filter 16 of the present embodiment.

Next, a specific configuration of the data converter section 13 will be described.

Figure 6:
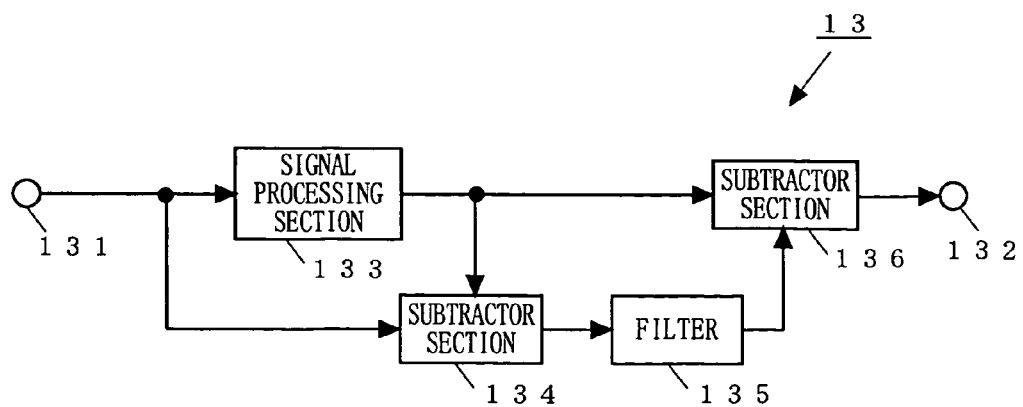
FIG. 6 is a block diagram showing an exemplary configuration of the data converter section 13 according to the first embodiment of the present invention.

FIG. 6 is a block diagram showing an exemplary configuration of the data converter section 13 according to the first embodiment of the present invention. Referring to FIG. 6, the data converter section 13 includes an input terminal 131, an output terminal 132, a signal processing section 133, a subtractor section 134, a filter 135 and a subtractor section 136.

In FIG. 6, the input terminal 131 receives I and Q data as a baseband signal. The I and Q data are inputted to the signal processing section 133 and to the subtractor section 134.

Figure 7:
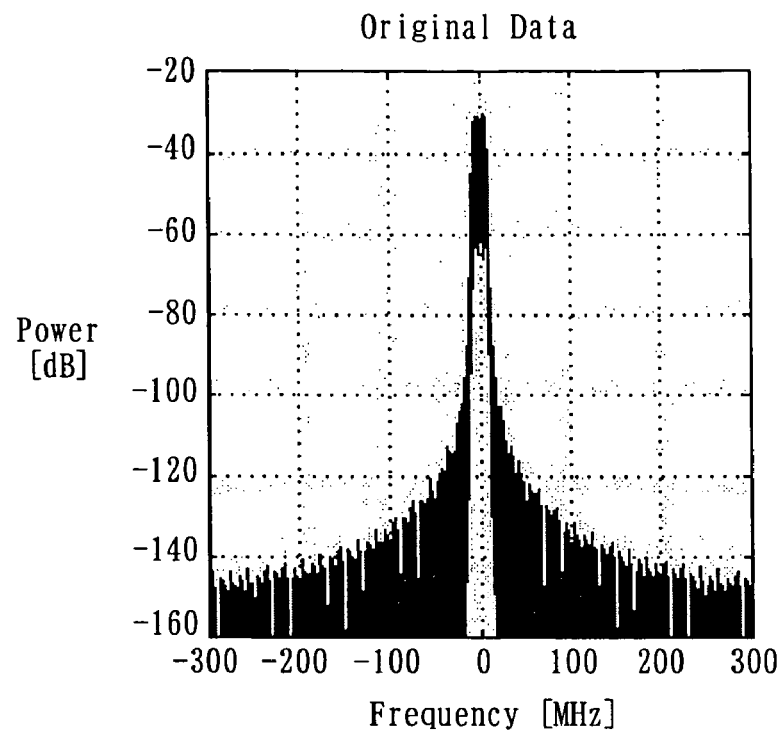
FIG. 7 shows an exemplary spectrum of a signal inputted to a signal processing section 133 and to a subtractor section 134.
Figure 8:
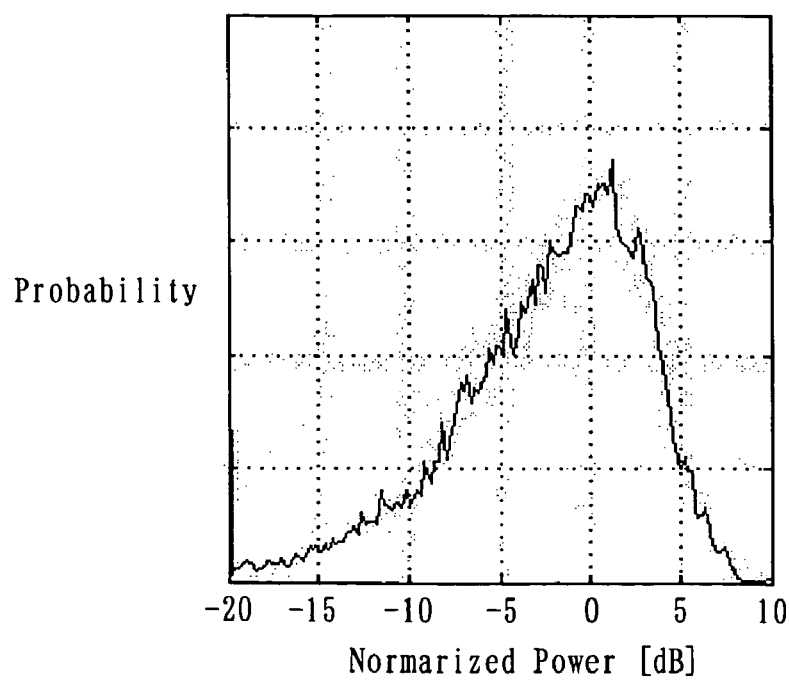
FIG. 8 shows a probability distribution of the sum of squares of vector data included in the input signal of FIG. 7.

FIG. 7 shows an exemplary spectrum of a signal inputted to the signal processing section 133 and to the subtractor section 134. In FIG. 7, the frequency along the horizontal axis represents the frequency shift with respect to the center frequency (intended wave frequency) of the input signal. FIG. 8 shows a probability distribution of the sum of squares of vector data included in the input signal of FIG. 7. Note that each exemplary waveform used in the description of the data converter section 13 is obtained by inputting, to the data converter section 13 shown in FIG. 6 via the input terminal 131, a signal that has undergone a primary modulation process with 16 QAM at a symbol rate of 20 MHz, and a secondary modulation process with OFDM at an FFT length of 64.

In FIG. 6, the signal processing section 133 discretizes the quadrature data (input signal) to output a signal having a lower resolution magnitude-wise than that of the input signal. The signal processing section 133 performs a sampling operation at a high rate when discretizing the input signal. For example, the signal processing section 133 may perform the sampling operation at an oversampling rate on the order of 10 to 1000. By performing such an oversampling operation, the signal processing section 133 can improve the Signal to Noise ratio of the output signal. The signal processing section 133 will be described later along with a specific configuration thereof.

Figure 9:
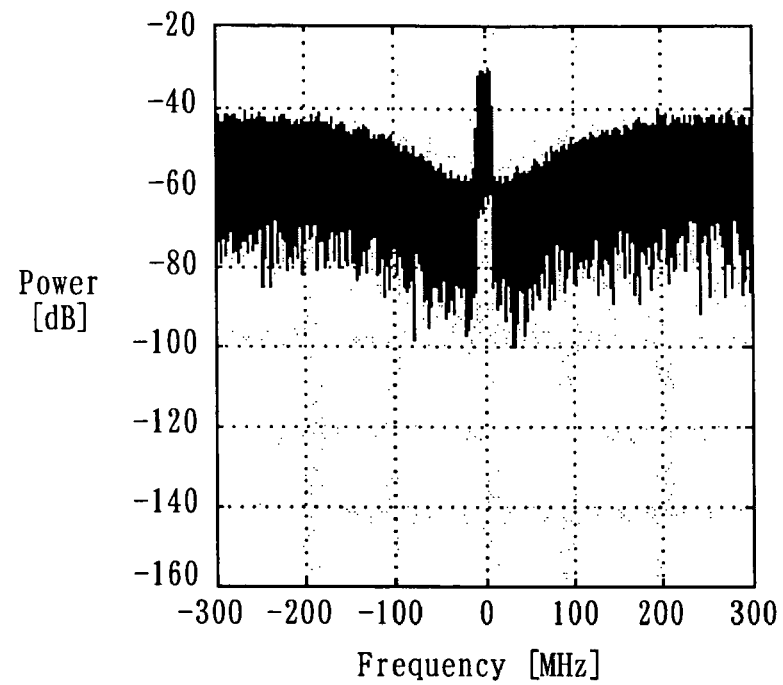
FIG. 9 shows an exemplary spectrum of a signal outputted from a signal processing section 133.
Figure 10:
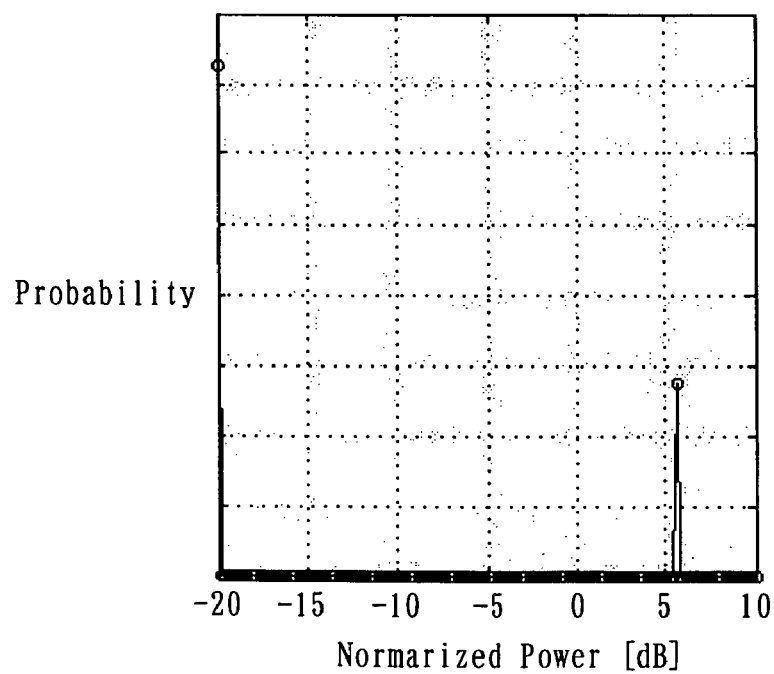
FIG. 10 shows a probability distribution of the sum of squares of vector data included in the signal of FIG. 9.

FIG. 9 shows an exemplary spectrum of a signal outputted from the signal processing section 133. FIG. 10 shows a probability distribution of the sum of squares of vector data included in the signal of FIG. 9. It is assumed that the signal processing section 133 has discretized the input signal into two values while setting the clock frequency thereof to 640 MHz (32 times the symbol rate). As shown in FIG. 9, the output signal from the signal processing section 133 contains a high level of quantization noise, which has been introduced by the discretization process, at frequencies near the intended wave frequency (center frequency).

In the probability distribution of the sum of squares of vector data of FIG. 10, as compared with that of FIG. 8, the magnitude of vector data is distinctly discretized into either zero or a constant. Although the probability distribution of FIG. 10 appears to have a peak at −20 dB, the peak is the result of having to integrate the existence probabilities over the range from minus infinity dB to −20 dB for the purpose of illustration. Note that it has been known that the probabilities are in fact localized at minus infinity dB.

The output signal from the signal processing section 133 is inputted to the subtractor section 134 and to the subtractor section 136. The subtractor section 134 subtracts the input signal (I,Q) from an output signal $(I_2,Q_2)$ of the signal processing section 133 to output a signal (Ie,Qe). Thus, the output signal (Ie,Qe) from the subtractor section 134 can be expressed as shown in Expressions 1 and 2 below, where I and Q represent the I and Q data (input signal), respectively.

$$Ie = I_2 - I \qquad \text{Exp. 1}$$

$$Qe = Q_2 - Q \qquad \text{Exp. 2}$$

Figure 11:
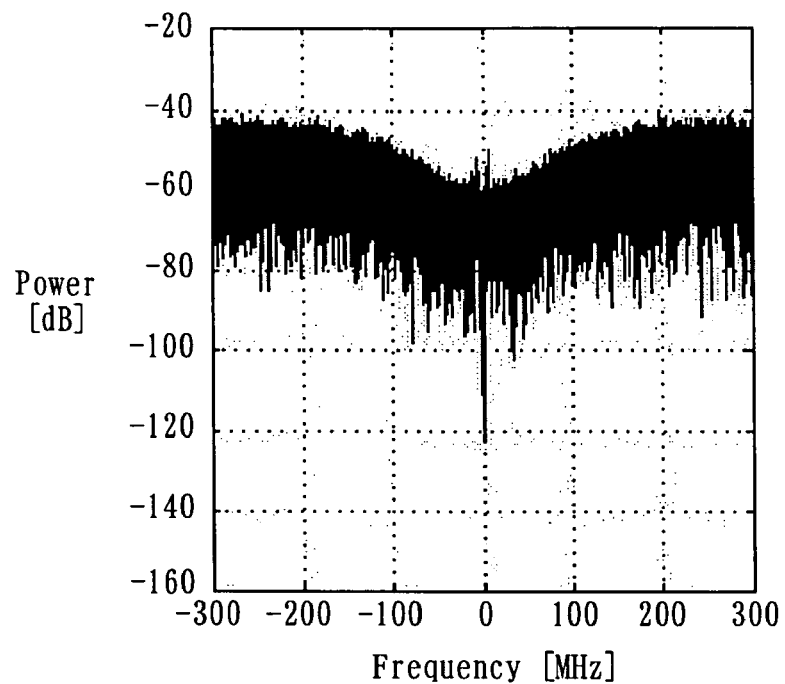
FIG. 11 shows an exemplary spectrum of an output signal from the subtractor section 134.

FIG. 11 shows an exemplary spectrum of an output signal from the subtractor section 134. The output signal (Ie,Qe) from the subtractor section 134 is obtained by subtracting the input signal from the output signal of the signal processing section 133. Thus, the output signal (Ie,Qe) from the subtractor section 134 represents the quantization noise generated in the signal processing section 133.

The quantization noise (Ie,Qe) from the subtractor section 134 is inputted to the filter 135. The filter 135 rejects the quantization noise with a predetermined cutoff frequency to output a signal $(Ie_2,Qe_2)$. The output signal $(Ie_2,Qe_2)$ from the filter 135 is inputted to the subtractor section 136.

Figure 12:
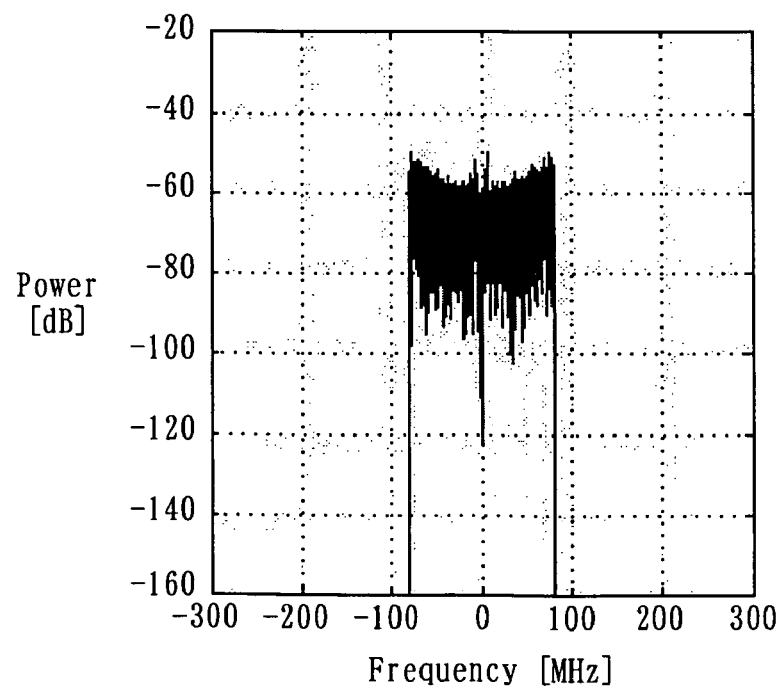
FIG. 12 shows an exemplary spectrum of an output signal from a filter 135.

FIG. 12 shows an exemplary spectrum of an output signal from the filter 135. It is assumed that the filter 135 is a low-pass filter having a cutoff frequency of 80 MHz. In FIG. 12, the output signal from the filter 135 represents the quantization noise near the intended wave frequency.

Figure 13:
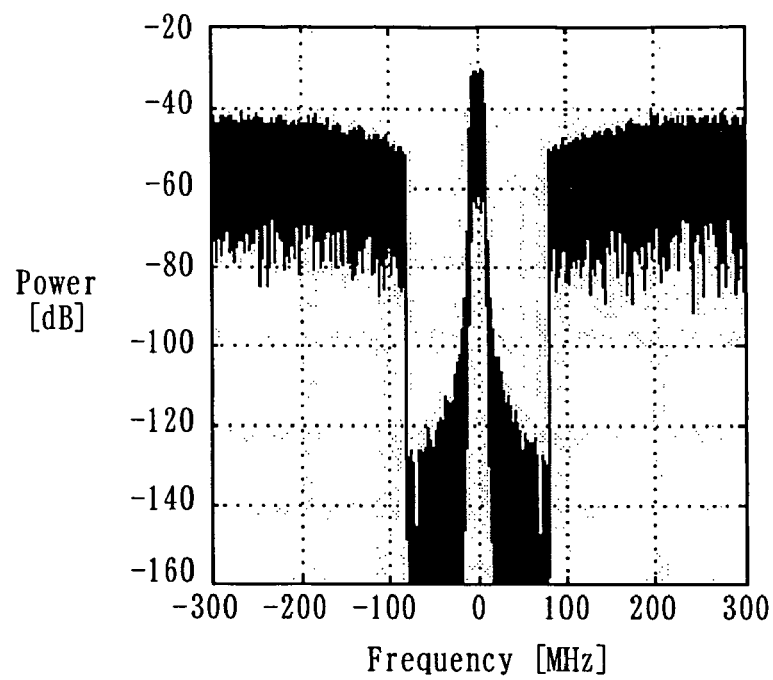
FIG. 13 shows an exemplary spectrum of an output signal from a subtractor section 136.

The subtractor section 136 receives the output signal from the signal processing section 133 (a signal containing quantization noise) and the output signal from the filter 135 (a signal representing quantization noise near the intended wave frequency). The subtractor section 136 subtracts the output signal of the filter 135 from the output signal of the signal processing section 133. FIG. 13 shows an exemplary spectrum of an output signal from the subtractor section 136. As shown in FIG. 13, the subtractor section 136 outputs a signal in which the quantization noise near the intended wave frequency is reduced. The output signal (It,Qt) from the subtractor section 136 can be expressed as shown in Expressions 3 and 4 below.

$$It = I_2 - Ie_2 \qquad \text{Exp. 3}$$

$$Qt = Q_2 - Qe_2 \qquad \text{Exp. 4}$$

Figure 14:
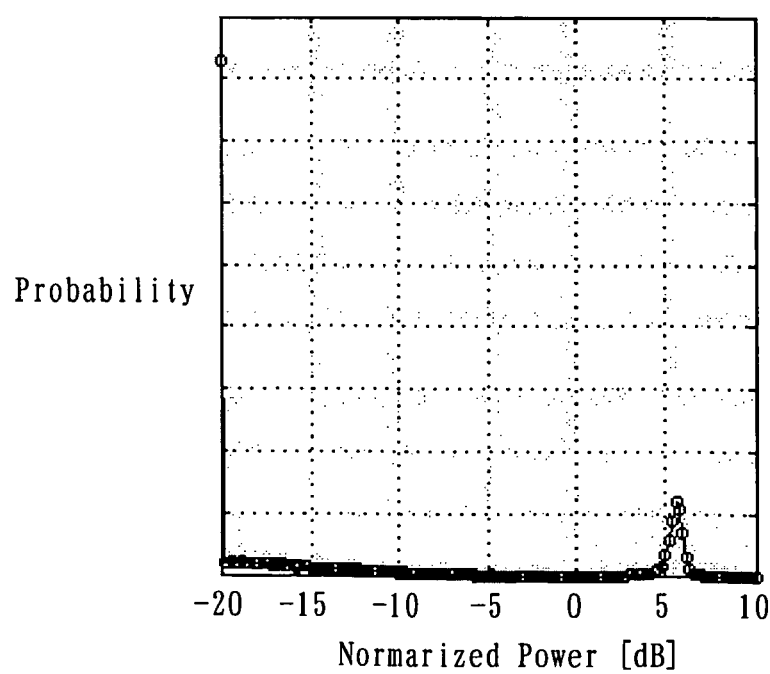
FIG. 14 shows a probability distribution of the sum of squares of vector data included in the signal of FIG. 13.

FIG. 14 shows a probability distribution of the sum of squares of vector data included in the signal of FIG. 13. Although the probability distribution of FIG. 14 is not completely discretized, it can be seen that it has a significantly reduced dynamic range as compared with that of FIG. 8. Therefore, the vector modulator section 14 and the amplifier 15 in the transmitter circuit 1 of FIG. 1, which process signals outputted from the data converter section 13, are only required to properly operate in this narrow range. Although the probability distribution of FIG. 14 appears to have a peak at −20 dB, the peak is the result of having to integrate the existence probabilities over the range from minus infinity dB to −20 dB for the purpose of illustration.

Figure 15:
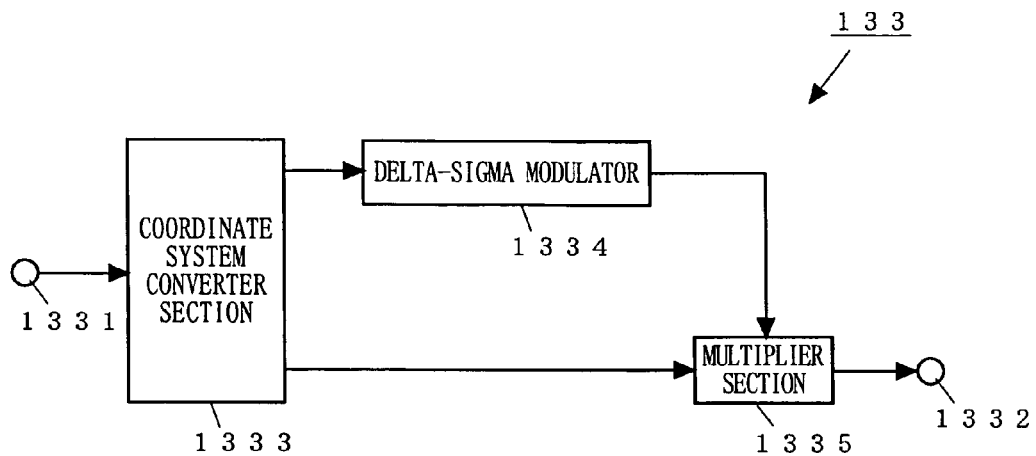
FIG. 15 is a block diagram showing a first configuration of the signal processing section 133.
Figure 16:
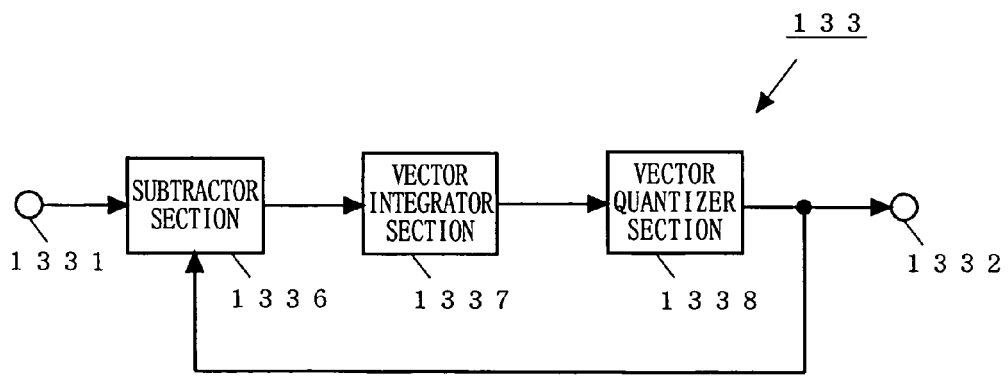
FIG. 16 is a block diagram showing a second configuration of the signal processing section 133.

Next, the signal processing section 133 will be described with two specific configurations thereof (FIG. 15 and FIG. 16).

A first configuration of the signal processing section 133 will now be described.

FIG. 15 is a block diagram showing the first configuration of the signal processing section 133. Referring to FIG. 15, the signal processing section 133 includes an input terminal 1331, an output terminal 1332, a coordinate system converter section 1333, a delta-sigma modulator 1334 and a multiplier section 1335.

In FIG. 15, the input terminal 1331 receives I and Q data as a baseband signal. The I and Q data are inputted to the coordinate system converter section 1333. The coordinate system converter section 1333 converts I and Q data being quadrature data to data of a polar coordinate system represented by amplitude data and phase data. Hereinafter, data of a polar coordinate system represented by amplitude data and phase data will be referred to as "polar coordinate data".

Thus, the coordinate system converter section 1333 outputs amplitude data M and phase data (Ip,Qp). The data (Ip,Qp) is obtained by representing the phase data in a rectangular coordinate system. The relationship between the amplitude data M and the phase data (Ip,Qp) can be expressed as shown in Expressions 5, 6 and 7 below, where I and Q represent the received baseband signal.

$$M = (I^2 + Q^2)^{1/2} \quad \text{Exp. 5}$$

$$Ip = I/M \quad \text{Exp. 6}$$

$$Qp = Q/M \quad \text{Exp. 7}$$

The amplitude data M from the coordinate system converter section 1333 is inputted to the delta-sigma modulator 1334. The delta-sigma modulator 1334 outputs, as a delta-sigma-modulated signal Md, a signal obtained by lowering the resolution of the amplitude data M by delta-sigma-modulating the amplitude data M. The delta-sigma-modulated signal Md is inputted to the multiplier section 1335. The delta-sigma modulator 1334 may perform first-order delta-sigma modulation or second-order delta-sigma modulation. The higher the order of the delta-sigma modulation is, the better the delta-sigma modulator 1334 can reduce the quantization noise near the intended wave frequency.

The phase data (Ip,Qp) outputted from the coordinate system converter section 1333 is inputted to the multiplier section 1335. The multiplier section 1335 multiplies the phase data (Ip,Qp) with the delta-sigma-modulated signal Md from the delta-sigma modulator 1334 to output a quadrature data signal $(I_2,Q_2)$. The output signal $(I_2,Q_2)$ from the multiplier section 1335 can be expressed as shown in Expressions 8 and 9 below. The signal $(I_2,Q_2)$ represented by Expressions 8 and 9 is outputted via the output terminal 1332.

$$I_2 = Md \cdot Ip \quad \text{Exp. 8}$$

$$Q_2 = Md \cdot Qp \quad \text{Exp. 9}$$

As described above, the signal processing section 133 of the first configuration delta-sigma-modulates the input signal, and thus can output a signal having a lower resolution magnitude-wise than that of the input signal.

Next, a second configuration of the signal processing section 133 will be described.

FIG. 16 is a block diagram showing the second configuration of the signal processing section 133. Referring to FIG. 16, the signal processing section 133 includes the input terminal 1331, the output terminal 1332, a subtractor section 1336, a vector integrator section 1337 and a vector quantizer section 1338.

In FIG. 16, the input terminal 1331 receives I and Q data as a baseband signal. The I and Q data are inputted to the vector integrator section 1337 via the subtractor section 1336. The vector integrator section 1337 integrates the I data and the Q data vector-wise to output an integrated signal (Iv, Qv). Thus, if a stream of quadrature data (Ii,Qi) is inputted to the vector integrator section 1337, the vector integrator section 1337 outputs a signal (Iv,Qv)=(ΣIi, ΣQi). The output signal (Iv,Qv) from the vector integrator section 1337 is inputted to the vector quantizer section 1338.

The vector quantizer section 1338 quantizes the input signal (Iv,Qv) to output a signal $(I_3,Q_3)$. $I_3$ and $Q_3$ can be expressed as shown in Expressions 10 and 11 or Expressions 12 and 13 below. In these expressions, "a" is a constant. It is assumed that the vector quantizer section 1338 quantizes the input signal using two values with respect to the magnitude of the input signal. Specifically, if the magnitude of the input signal, $(Iv^2+Qv^2)^{1/2}$, is equal to or greater than the predetermined threshold value "a", the vector quantizer section 1338 outputs a signal having a magnitude of "a" and a phase equal to that of the input signal, and if the magnitude of the input signal is less than the predetermined threshold value "a", the vector quantizer section 1338 outputs a zero vector. The subtractor section 1336 subtracts the output of the vector quantizer section 1338 from the input data to output the result to the vector integrator section 1337.

where $(Iv^2+Qv^2)^{1/2} \geq a$, $$I_3 = a \cdot Iv/(Iv^2+Qv^2)^{1/2} \quad \text{Exp. 10}$$

$$Q_3 = a \cdot Qv/(Iv^2+Qv^2)^{1/2} \quad \text{Exp. 11}$$

where $(Iv^2+Qv^2)^{1/2} < a$, $$I_3 = 0 \quad \text{Exp. 12}$$

$$Q_3 = 0 \quad \text{Exp. 13}$$

Thus, the signal processing section 133 of the second configuration vector-integrates and quantizes the input signal, and thus can output a signal having a lower resolution magnitude-wise than that of the input signal.

According to Nyquist's theorem, it is preferred that the cutoff frequency of the filter 135 of the data converter section 13 shown in FIG. 6 is smaller than ½ the clock frequency of the delta-sigma modulator 1334 shown in FIG. 15 or the vector quantizer section 1338 shown in FIG. 16.

While the signal processing section 133 of the first configuration shown in FIG. 15 uses the delta-sigma modulator 1334, the modulator is not limited to a delta-sigma modulator as long as it is capable of discretizing an input signal. For example, the delta-sigma modulator 133 may be a delta modulator or a pulse width modulator, instead of the delta-sigma modulator 1334.

Figure 17:
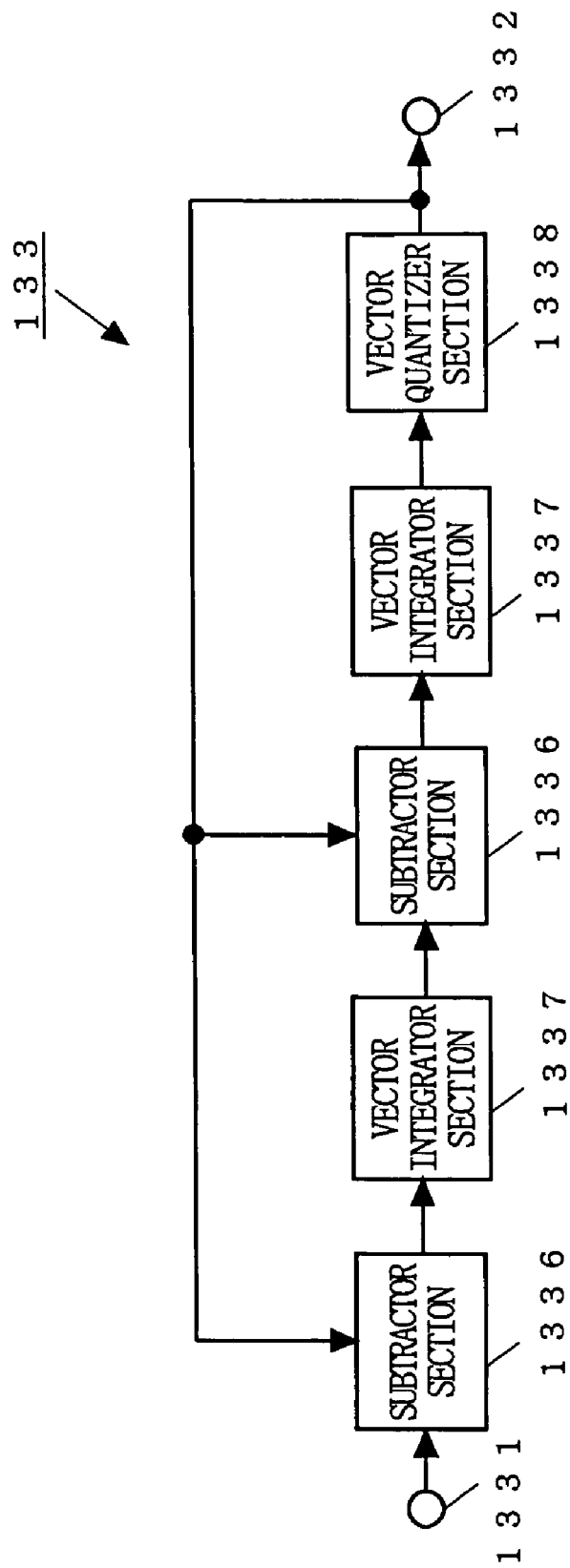
FIG. 17 is a block diagram showing an exemplary configuration of the high-order signal processing section 133.
Figure 18:
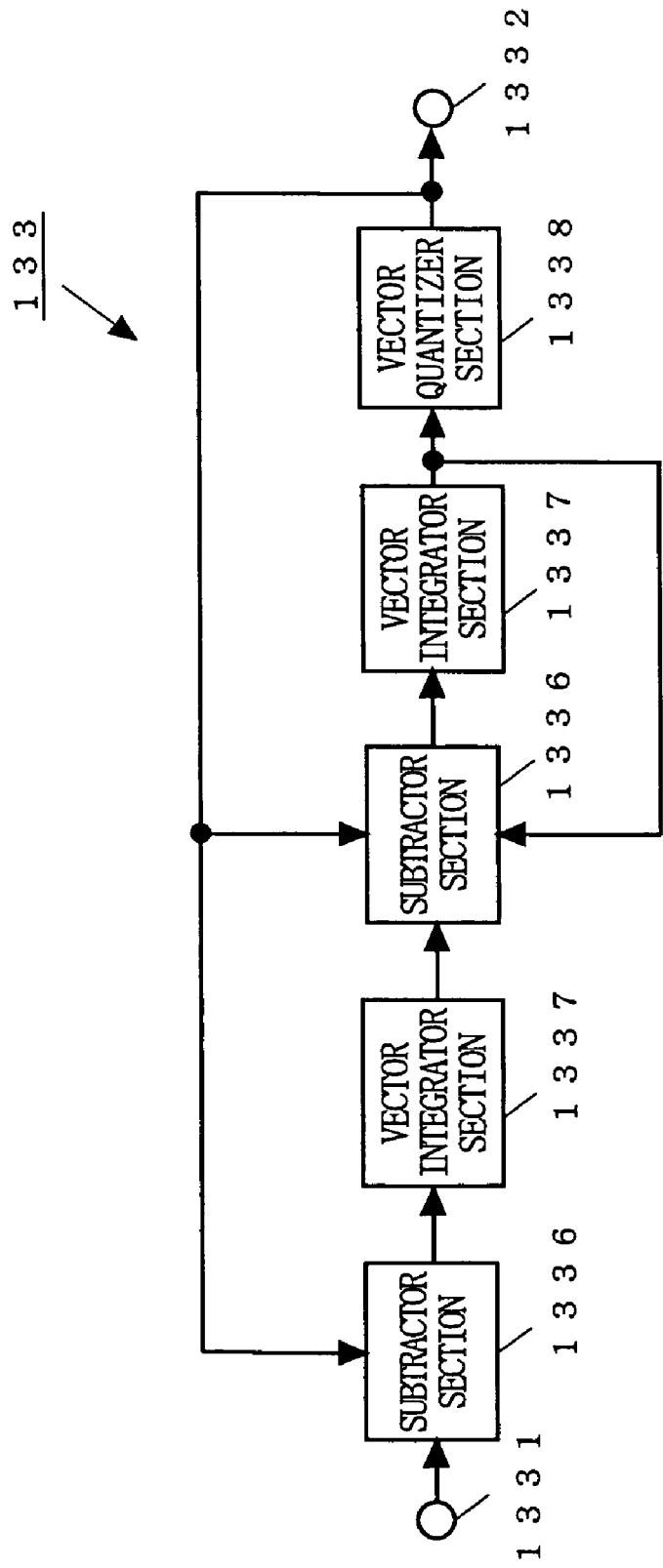
FIG. 18 is a block diagram showing an exemplary configuration of the high-order signal processing section 133.

The signal processing section 133 of the second configuration may be of a higher-order configuration using a plurality of sets of the subtractor section 1336 and the vector integrator section 1337 (see FIG. 17 and FIG. 18). With such a higher-order configuration, the signal processing section 133 of the second configuration can better reduce the quantization noise near the intended wave frequency.

As described above, the data converter section of the first embodiment discretizes the input signal into a signal having a lower resolution than that of the input signal, and then removes the quantization noise introduced by the discretization process from near the intended wave frequency. Therefore, the data converter section can output a signal in which the quantization noise is reduced near the intended wave frequency without requiring a troublesome control. Moreover, the data converter section does not need to increase the clock frequency or the order of the delta-sigma modulator to reduce the quantization noise near the intended wave frequency. Accordingly, the power consumption can be reduced.

Moreover, since the quantization noise near the intended wave frequency is reduced, the transmitter circuit of the present embodiment does not need to use a bandpass filter having steep attenuation characteristics. Therefore, it is possible to reduce the overall power consumption of the transmitter circuit. Moreover, even if the frequency band of the transmitted signal changes, it is not necessary to switch the pass band of the bandpass filter from one to another. Accordingly, the power consumption can be reduced, and the circuit scale can also be reduced.

Second Embodiment

Figure 19:
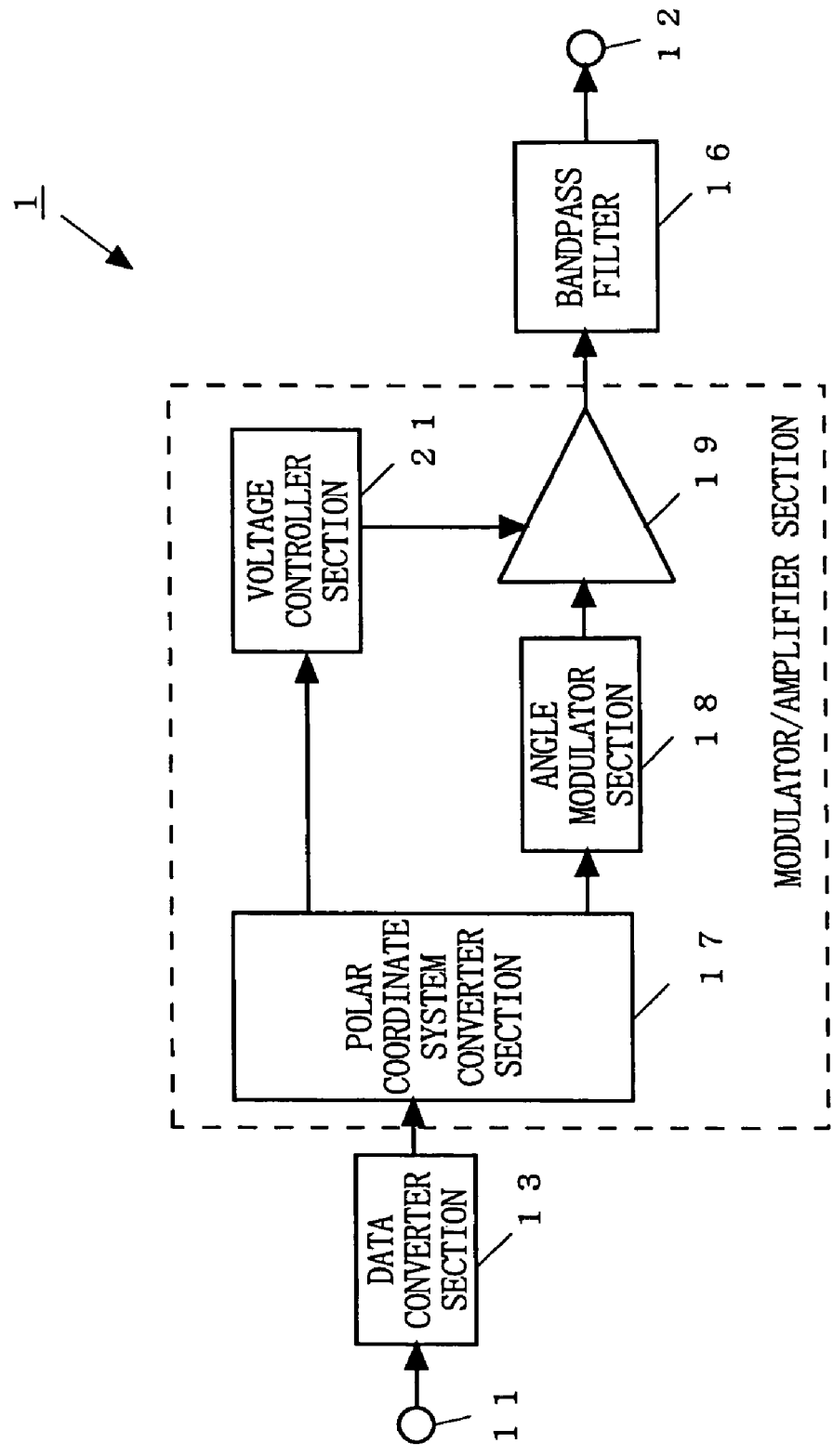
FIG. 19 is a block diagram showing an exemplary configuration of the transmitter circuit 1 according to a second embodiment of the present invention.

FIG. 19 is a block diagram showing an exemplary configuration of the transmitter circuit 1 according to a second embodiment of the present invention. The transmitter circuit 1 of the present embodiment differs from the first embodiment (FIG. 1) in the section for modulating or amplifying the output signal from the data converter section (modulator/amplifier section) The transmitter circuit of the second embodiment produces a signal to be transmitted by performing polar modulation on the output signal from the data converter section. Therefore, the data converter section itself is as illustrated in the first embodiment. The following description focuses on features that are different from the first embodiment.

Referring to FIG. 19, the transmitter circuit 1 includes the input terminal 11, the output terminal 12, the data converter section 13, a polar coordinate system converter section 17, an angle modulator section 18, an amplitude modulator section 19, a voltage controller section 21 and the bandpass filter 16.

The polar coordinate system converter section 17 converts received quadrature data to amplitude data and phase data being polar coordinate data. The angle modulator section 18 angle-modulates the phase data. The voltage controller section 21 supplies, to the amplitude modulator section 19, a voltage that is controlled according to the amplitude data. The amplitude modulator section 19 amplitude-modulates the signal angle-modulated by the angle modulator section 18 with the voltage that is controlled according to the amplitude data. The data converter section 13 and the bandpass filter 16 are similar in configuration to those of the first embodiment. The polar coordinate system converter section 17, the angle modulator section 18, the amplitude modulator section 19 and the voltage controller section 21 together form a modulator/amplifier section.

The operation of the transmitter circuit 1 will now be described.

Referring to FIG. 19, the transmitter circuit 1 operates as described above in the first embodiment up to the point where the data converter section 13 gives an output signal. The output signal from the data converter section 13 is inputted to the polar coordinate system converter section 17. The polar coordinate system converter section 17 converts the input signal being quadrature data to a signal of a polar coordinate system. Specifically, the polar coordinate system converter section 17 converts the coordinates of the input signal to output amplitude data being the amplitude component and phase data being the phase component. Where the data converter section 13 has quantized the input signal by a 1-bit quantization (i.e., into two values of zero and a real number), the amplitude data outputted from the polar coordinate system converter section 17 has a signal waveform as if the output were turned ON/OFF periodically. Thus, the polar coordinate system converter section 17 can output a signal that is not completely discretized magnitude-wise but has an envelope having only two states (i.e., ON and OFF) with little fluctuations in the envelope in each state. Therefore, the signal outputted from the polar coordinate system converter section 17 is less likely to be influenced by the non-linearity of the amplitude modulator section 19.

The phase data is inputted to the angle modulator section 18. The angle modulator section 18 angle-modulates the received phase data to output an angle-modulated wave signal. The angle-modulated wave signal is inputted to the amplitude modulator section 19. The amplitude data from the polar coordinate system converter section 17 is inputted to the voltage controller section 21. The voltage controller section 21 supplies, to the amplitude modulator section 19, a voltage that is controlled according to the amplitude data. The amplitude modulator section 19 amplitude-modulates the angle-modulated wave signal from the angle modulator section 18 with the voltage that is controlled according to the amplitude data to output a modulated wave signal.

The modulated wave signal from the amplitude modulator section 19 is inputted to the bandpass filter 16. The bandpass filter 16 removes out-of-band, unnecessary quantization noise components from the received modulated wave signal to output an intended modulated wave signal.

Figure 20:
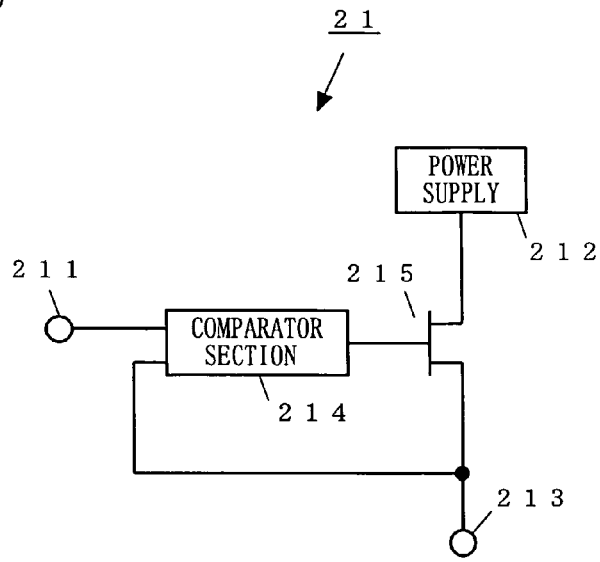
FIG. 20 is a block diagram showing an exemplary configuration of a voltage controller section 21 using a series regulator.

The voltage controller section 21 may be, for example, a series regulator or a switching regulator. FIG. 20 is a block diagram showing an exemplary configuration of the voltage controller section 21 using a series regulator. Referring to FIG. 20, the voltage controller section 21 includes an input terminal 211, a power supply 212, an output terminal 213, a comparator section 214 and a transistor 215.

In FIG. 20, amplitude data is inputted to the input terminal 211. The amplitude data is inputted to the gate or base of the transistor 215 via the comparator section 214. Thus, a voltage according to the amplitude data is applied to the gate or base of the transistor 215. Moreover, a voltage from the power supply 212 is applied to the drain or collector of the transistor 215. Therefore, a voltage that is controlled according to the amplitude data is outputted from the source or emitter of the transistor 215. In the voltage controller section 21, the voltage outputted from the source or emitter of the transistor 215 may be fed back to the comparator section 214 in order to stabilize the output. The voltage that is controlled according to the amplitude data is supplied to the amplitude modulator section 19 via the output terminal 213.

Figure 21:
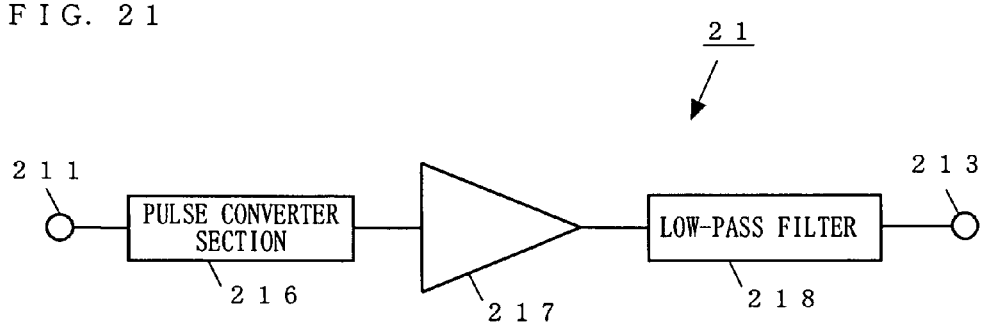
FIG. 21 is a block diagram showing an exemplary configuration of the voltage controller section 21 using a switching regulator.

FIG. 21 is a block diagram showing an exemplary configuration of the voltage controller section 21 using a switching regulator. The voltage controller section 21 includes the input terminal 211, a pulse converter section 216, an amplifier 217, a low-pass filter 218 and the output terminal 213.

In FIG. 21, amplitude data is inputted to the input terminal 211. The amplitude data is converted by the pulse converter section 216 to a pulse signal. The conversion method used in the pulse converter section 216 may be, for example, a PWM method, a delta-sigma modulation method, or the like. The converted pulse signal is amplified through the amplifier 217 and passed to the low-pass filter 218. The amplified pulse signal passes through the low-pass filter 218, where a spurious signal of the clock frequency or the switching frequency generated in the pulse generation process is removed from the amplified pulse signal, and the filtered signal is outputted via the output terminal 213. Thus, a voltage whose output level is controlled by the amplitude data is supplied to the amplitude modulator section 19. In the voltage controller section 21, the output from the low-pass filter 218 may be fed back to the pulse converter section 216 in order to stabilize the output.

As described above, also in the transmitter circuit 1 according to the second embodiment of the present invention, the data converter section outputs a signal in which the quantization noise is reduced near the intended wave frequency. Thus, the transmitter circuit 1 of the present embodiment can provide similar effects to those of the first embodiment.

Third Embodiment

Figure 22:
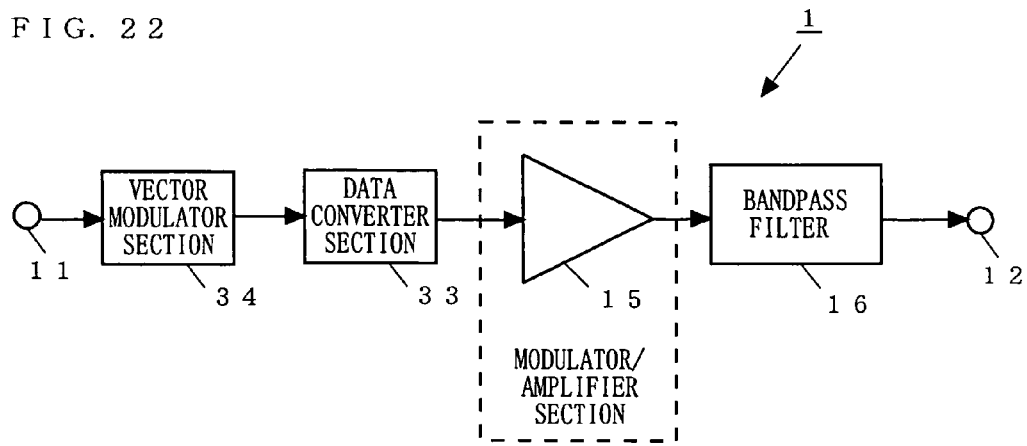
FIG. 22 is a block diagram showing an exemplary configuration of the transmitter circuit 1 according to a third embodiment of the present invention.

FIG. 22 is a block diagram showing an exemplary configuration of the transmitter circuit 1 according to a third embodiment of the present invention. The transmitter circuit 1 of the present embodiment differs from the transmitter circuit 1 of the first embodiment (FIG. 1) in that a vector modulator section 34 is provided preceding a data converter section 33. Therefore, the data converter section 33 receives a signal that has already been modulated through the vector modulator section 34 (a modulated wave signal) instead of receiving I and Q data. In other words, the data converter section 33 of the present embodiment processes modulated wave signals (scalar data), as opposed to the data converter section 13 of the first embodiment, which processes quadrature data (vector data).

Referring to FIG. 22, the transmitter circuit 1 includes the input terminal 11, the output terminal 12, the vector modulator section 34, the data converter section 33, the amplifier 15 and the bandpass filter 16.

The data converter section 33 performs a predetermined data conversion operation on the input signal being a modulated wave signal. The vector modulator section 34, the amplifier 15 and the bandpass filter 16 are similar in configuration to those of the transmitter circuit 1 of the first embodiment (FIG. 1). Note that in the transmitter circuit 1, the vector modulator section 34 is optional. This is because a distinctive feature of the present invention lies in the data converter section 33 and in the section of the transmitter circuit 1 that processes the output signal from the data converter section 33. If the vector modulator section 34 is absent in the transmitter circuit 1, an already-modulated signal (a modulated wave signal) may be inputted to the data converter section 33. The amplifier 15 forms a modulator/amplifier section.

The operation of the transmitter circuit 1 will now be described.

I and Q data being quadrature data are inputted to the input terminal 11. The received I and Q data are inputted to the vector modulator section 34. The vector modulator section 34 modulates the received I and Q data to output a modulated wave signal. The vector modulator section 34 outputs a modulated wave signal by, for example, performing a quadrature modulation operation on the input signal. The modulated wave signal from the vector modulator section 34 is inputted to the data converter section 33. Thus, the data converter section 33 receives an already-modulated signal (a modulated wave signal). Note that the modulated wave signal inputted to the data converter section 33 may be a multiple-bit digital signal (i.e., an already discretized signal) or an analog signal (i.e., an un-discretized signal).

Figure 23:
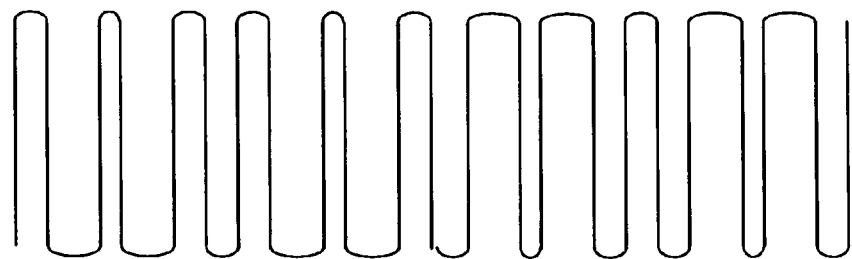
FIG. 23 shows an exemplary waveform of an output signal where a data converter section 33 according to the third embodiment of the present invention discretizes an input signal into two values.

The data converter section 33 discretizes the modulated wave signal (input signal) into a signal having a lower resolution magnitude-wise than that of the input signal. Then, the data converter section 33 removes quantization noise from near the intended wave frequency of the signal having a lower resolution magnitude-wise, and outputs the obtained signal. FIG. 23 shows an exemplary waveform of the output signal where the data converter section 33 according to the third embodiment of the present invention discretizes the input signal into two values. As shown in FIG. 23, the data converter section 33 outputs a signal that is not completely discretized but has little fluctuations in the peak portions of the envelope. In FIG. 23, the peak portions of the envelope are not constant (completely straightened) because a portion of quantization noise has been removed in the data converter section 33.

The output signal from the data converter section 33 is inputted to the amplifier 15. The amplifier 15 amplifies the input signal to a required output level. The output signal from the amplifier 15 is inputted to the bandpass filter 16. The bandpass filter 16 removes out-of-band, unnecessary components from the received signal to output an intended signal.

Figure 24:
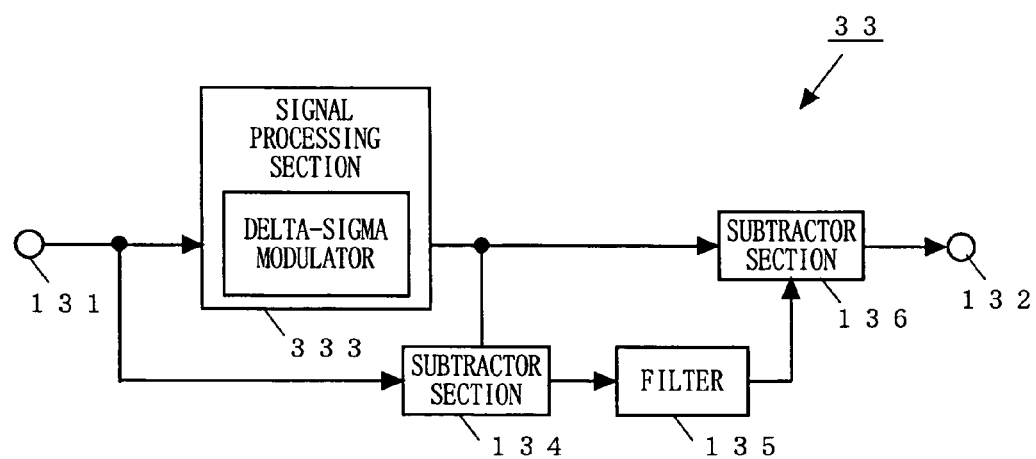
FIG. 24 is a block diagram showing an exemplary configuration of the data converter section 33 according to the third embodiment of the present invention.

FIG. 24 is a block diagram showing an exemplary configuration of the data converter section 33 according to the third embodiment of the present invention. The data converter section 33 includes the signal processing section 333, the subtractor section 134, the filter 135 and the subtractor section 136. The signal processing section 333 discretizes the input signal. The signal processing section 333 is, for example, a delta-sigma modulator. The subtractor section 134, the filter 135 and the subtractor section 136 are similar in configuration to those of the data converter section 13 of the first embodiment.

The signal processing section 333 receives a modulated wave signal. The signal processing section 333 delta-sigma-modulates the input signal (a modulated wave signal) using a delta-sigma modulator to output a signal having a lower resolution magnitude-wise than that of the input signal. After the signal processing section 333 gives an output signal, the signal processing section 33 operates as does the data converter section 13 of the first embodiment.

According to Nyquist's theorem, it is preferred that the cutoff frequency of the filter 135 of the data converter section 33 shown in FIG. 24 is smaller than ½ the clock frequency of the delta-sigma modulator of the signal processing section 333 (i.e., the sampling frequency) if the filter 135 is a lowpass filter. If the filter 135 is a bandpass filter, the cutoff frequency of the filter 135 is preferably larger than the center frequency of the input signal minus ½ the sampling frequency and smaller than the center frequency of the input signal plus ½ the sampling frequency.

Moreover, a distinctive feature of the data converter section 33 of the third embodiment lies in between the signal processing section 333 and the filter 135. In FIG. 24, the spectrum of the quantization noise signal generated in the signal processing section 333 varies depending on the characteristics of the signal processing section 333. Therefore, the type of the filter 135 in the data converter section 33 is determined depending on the characteristics of the signal processing section 333.

In the signal processing section 333, the output signal y(z) can be expressed as shown in Expression 14 below, where x(z) is the input signal, H1(z) is the input signal transfer function, e(z) is the quantization noise signal introduced by the quantization process and H2(z) is the noise transfer function.

$$y(z) = H1(z) \cdot x(z) + H2(z) \cdot e(z) \qquad \text{Exp. 14}$$

It can be seen from Expression 14 that the quantization noise signal H2(z)·e(z) outputted from the signal processing section 333 is inputted to the filter 135. The spectrum of the quantization noise signal H2(z)·e(z) varies depending on the position of the zero point of the noise transfer function H2(z). Therefore, in the data converter section 33, the type of the filter 135 for reducing the quantization noise signal H2(z)·e(z) is determined depending on the position of the zero point of the noise transfer function H2(z) in the signal processing section 333.

Figure 25:
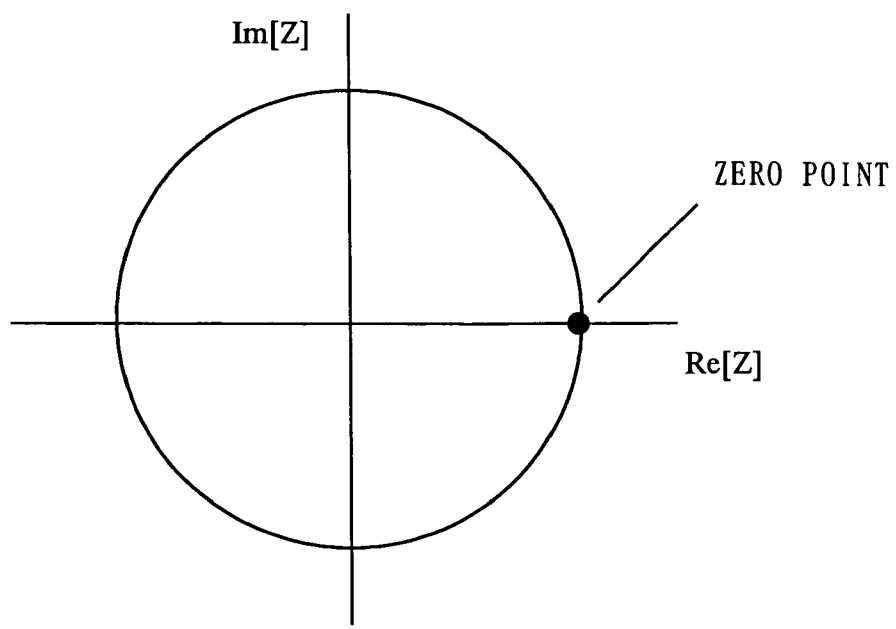
FIG. 25 shows the position of the zero point in a noise transfer function having a zero point of 1.
Figure 26:
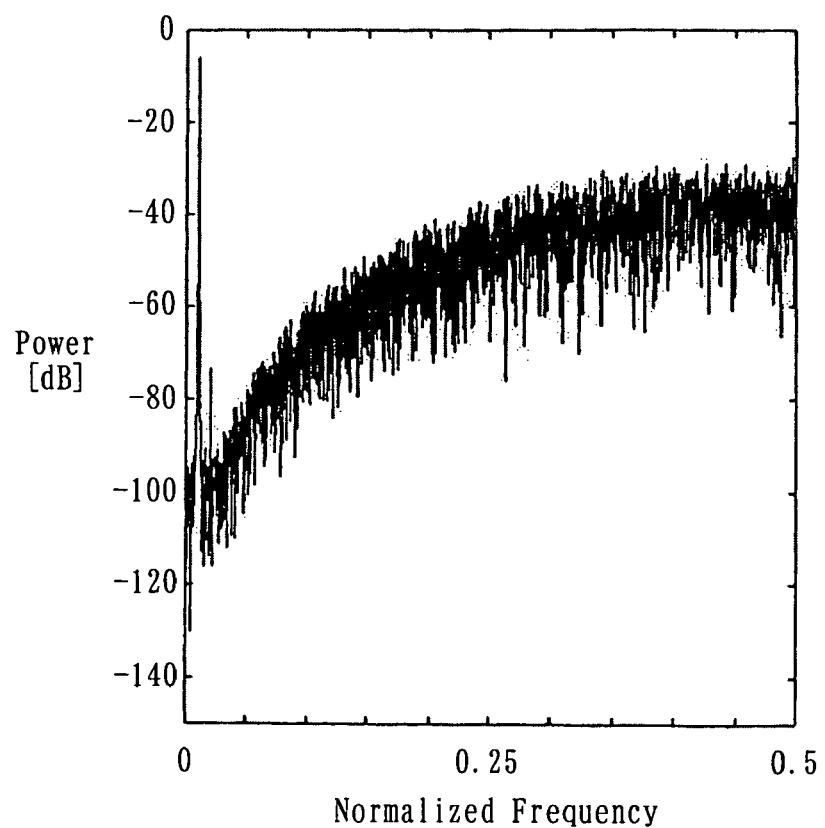
FIG. 26 shows an exemplary spectrum of a signal outputted from a signal processing section 333 whose noise transfer function has a zero point of 1.

A spectrum varying depending on the position of the zero point of a noise transfer function is disclosed in, for example, "Delta-Sigma Data Converters" by S. R. Norsworthy, R. Schreier, G. C. Temes, 1996 IEEE (ISBN 0-7803-1045-4). FIG. 25 shows the position of the zero point in a noise transfer function having a zero point of 1. FIG. 26 shows an exemplary spectrum of the signal outputted from the signal processing section 333 whose noise transfer function has a zero point of 1. As shown in FIG. 26, for the signal outputted from the signal processing section 333 whose noise transfer function has a zero point of 1, a frequency that minimizes the quantization noise signal is 0 Hz (i.e., a direct current).

Therefore, referring to FIG. 24, if the signal processing section 333 whose noise transfer function has a zero point of 1 is used, a low-pass filter is used as the filter 135 for removing out-of-band quantization noise.

Where a delta-sigma modulator is used in such a signal processing section 333, a delta-sigma modulator of a low-pass type is used.

Figure 27:
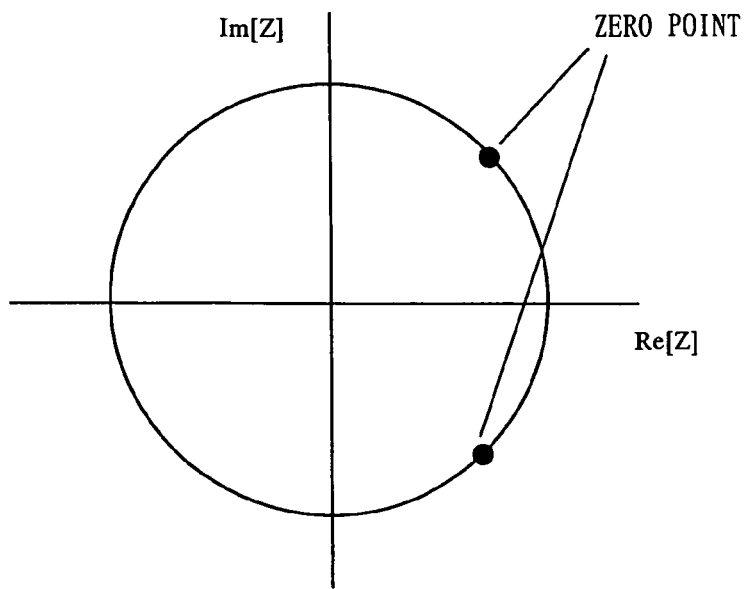
FIG. 27 shows the position of the zero point in a noise transfer function having a zero point of a complex number whose magnitude is 1.
Figure 28:
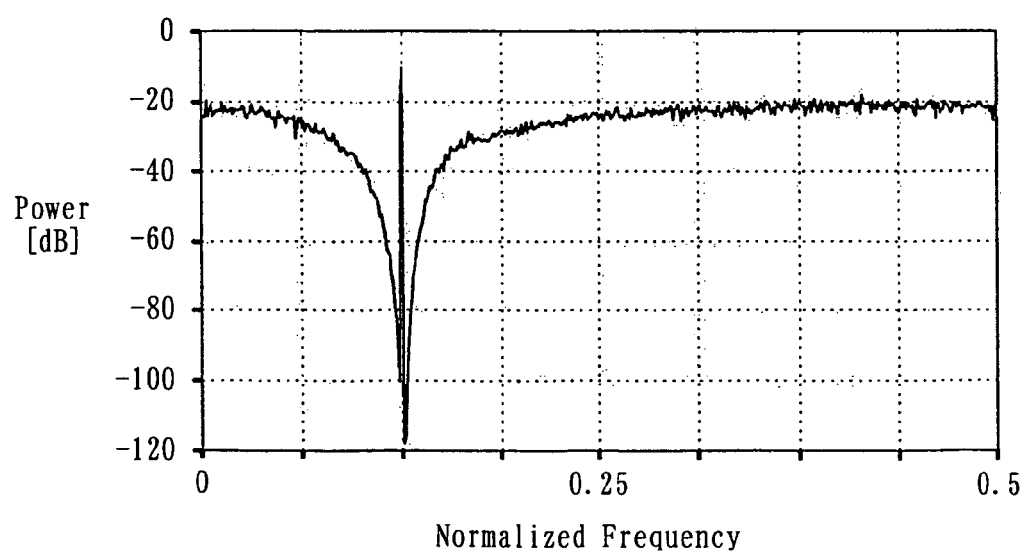
FIG. 28 shows an exemplary spectrum of a signal outputted from a signal processing section 333 whose noise transfer function has a zero point of a complex number whose magnitude is 1.

FIG. 27 shows the position of the zero point in a noise transfer function having a zero point of a complex number whose magnitude is 1. Note that FIG. 27 shows the position of the zero point of the noise transfer function in a case where the magnitude thereof is 1 and the argument thereof is $\pm \pi/4$. FIG. 28 shows an exemplary spectrum of a signal outputted from the signal processing section 333 whose noise transfer function has a zero point of a complex number whose magnitude is 1. As shown in FIG. 28, for the signal outputted from the signal processing section 333 whose noise transfer function has a zero point of a complex number whose magnitude is 1, a frequency that minimizes the quantization noise is the normalized frequency obtained by dividing the argument of the zero point by $2\pi$. The signal processing section 333 is designed so that the intended wave frequency is close to the frequency that minimizes the quantization noise.

Thus, where the signal processing section 333 whose noise transfer function has a zero point of a complex number whose magnitude is 1 is used in FIG. 24, a bandpass filter is used as the filter 135 for removing out-of-band quantization noise.

Where a delta-sigma modulator is used in such a signal processing section 333, a delta-sigma modulator of a bandpass type is used.

The distinctive feature between the signal processing section 333 and the filter 135 can be used not only for the data converter section 33 to which scalar data is inputted (FIG. 24), but also for a data converter section to which vector data is inputted. Therefore, a signal processing section whose noise transfer function has a zero point of 1 and a signal processing section whose noise transfer function has a zero point of a complex number whose magnitude is 1 can also be used in the data converter section 13 of the first and second embodiments (FIG. 6). The reason for this will now be described.

A signal $(I_2(z), Q_2(z))$ outputted from the data converter section 13 to which vector data is inputted (FIG. 6) can be expressed as shown in Expressions 15 and 16 below, where $I(z)$ and $Q(z)$ represent the input signal, $H1i(z)$ and $H1q(z)$ are input signal transfer functions, $Ie(z)$ and $Qe(z)$ represent the quantization noise signal, and $H2i(z)$ and $H2q(z)$ are noise transfer functions.

$$I_2(z) = H1i(z) \cdot I(z) + H2i(z) \cdot Ie(z) \quad \text{Exp. 15}$$

$$Q_2(z) = H1q(z) \cdot Q(z) + H2q(z) \cdot Qe(z) \quad \text{Exp. 16}$$

It can be seen from Expressions 15 and 16 that the quantization noise signal $(H2i(z) \cdot Ie(z), H2q(z) \cdot Qe(z))$ outputted from the signal processing section 133 is inputted to the filter 135. The spectrum of the quantization noise signal varies depending on the position of the zero point of the noise transfer functions $H2i(z)$ and $H2q(z)$, as with the signal processing section 333 to which scalar data is inputted. Therefore, in the data converter section 13, the type of the filter 135 for reducing the quantization noise signal is determined depending on the position of the zero point of the noise transfer function in the signal processing section 133.

As described above, the data converter section of the third embodiment can output a signal in which the quantization noise near the intended wave frequency is reduced. Therefore, the data converter section can provide similar effects to those of the first embodiment. Moreover, in the transmitter circuit of the present embodiment, a signal in which the quantization noise near the intended wave frequency has been removed is inputted to the amplifier 15 and to the bandpass filter 16, thereby providing similar effects to those of the first embodiment.

Fourth Embodiment

Figure 29:
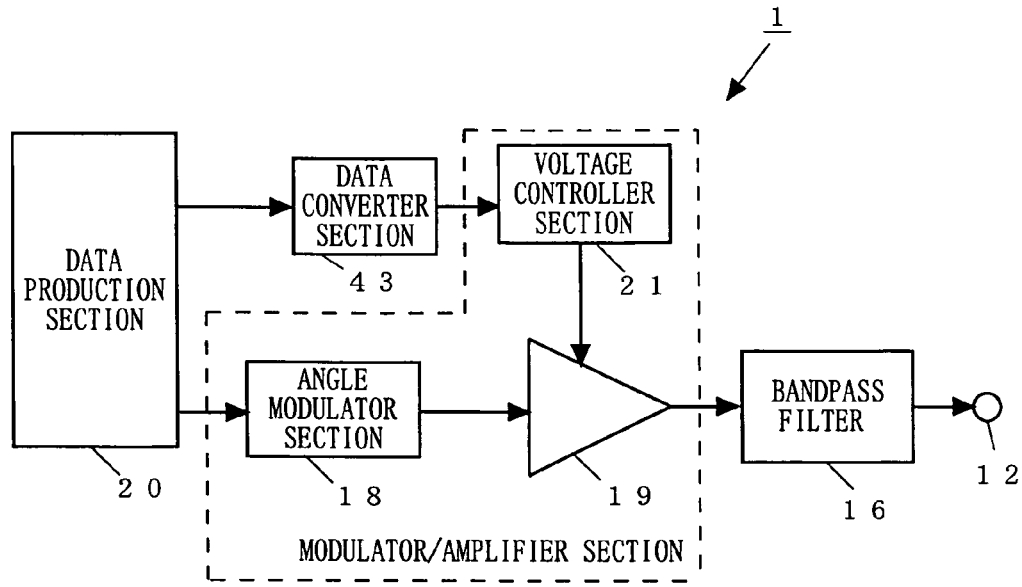
FIG. 29 is a block diagram showing an exemplary configuration of the transmitter circuit 1 according to a fourth embodiment of the present invention.

FIG. 29 is a block diagram showing an exemplary configuration of the transmitter circuit 1 according to a fourth embodiment of the present invention. The transmitter circuit 1 of the present embodiment includes a data converter section 43 that processes amplitude data being polar coordinate data, as opposed to the transmitter circuit 1 of the second embodiment (FIG. 19) including the data converter section 13 that processes quadrature data. Therefore, the data converter section 43 of the present embodiment receives amplitude data, instead of I and Q data being quadrature data. The data converter section 43 of the present embodiment is similar to the data converter section 33 of the third embodiment in that scalar data is processed.

Referring to FIG. 29, the transmitter circuit 1 includes the output terminal 12, a data production section 20, the data converter section 43, the angle modulator section 18, the amplitude modulator section 19, the voltage controller section 21 and the bandpass filter 16.

The data production section 20 outputs amplitude data and phase data. The data converter section 43 performs a predetermined data conversion operation on the amplitude data. The angle modulator section 18, the amplitude modulator section 19, the voltage controller section 21 and the bandpass filter 16 are similar in configuration to those of the second embodiment. The angle modulator section 18, the amplitude modulator section 19 and the voltage controller section 21 together form a modulator/amplifier section.

The operation of the transmitter circuit 1 will now be described.

The data production section 20 receives I and Q data (not shown), and outputs amplitude data and phase data based on the received I and Q data. The data production section 20 is similar to the polar coordinate system converter section 17 in the transmitter circuit 1 of the second embodiment (FIG. 19) in that amplitude data and phase data are outputted based on I and Q data.

In the transmitter circuit 1, the data production section 20 is optional. This is because a distinctive feature of the present invention lies in the section of the transmitter circuit 1 that processes the output signal from the data converter section 43. If the data production section 20 is absent in the transmitter circuit 1, amplitude data may be inputted directly to the data converter section 43, and phase data may be inputted directly to the angle modulator section 18.

The data converter section 43 receives amplitude data. The data converter section 43 discretizes the received amplitude data into a signal having a lower resolution than that of the received amplitude data. In the data converter section 43, the process of discretizing the amplitude data introduces noise components called "quantization noise" having frequencies other than the intended wave frequency. Therefore, the data converter section 43 removes quantization noise from near the intended wave frequency to output a signal in which the quantization noise is reduced near the intended wave frequency.

The data converter section 43 of the present embodiment processes amplitude data being scalar data, and therefore can be similar in configuration to the data converter section 33 of the third embodiment shown in FIG. 24.

The output signal from the data converter section 43 is inputted to the voltage controller section 21. The voltage controller section 21 supplies, to the amplitude modulator section 19, a voltage that is controlled according to the signal outputted from the data converter section 43. The phase data is inputted to the angle modulator section 18. The angle modulator section 18 angle-modulates the received phase data to output an angle-modulated wave signal. The angle-modulated wave signal is inputted to the amplitude modulator section 19.

The amplitude modulator section 19 amplitude-modulates the angle-modulated wave signal with the voltage that is controlled according to the signal outputted from the data converter section 43 to output a modulated wave signal. The modulated wave signal from the amplitude modulator section 19 is inputted to the bandpass filter 16. The bandpass filter 16 removes out-of-band, unnecessary quantization noise components from the received modulated wave signal to output an intended modulated wave signal.

As described above, the data converter section of the fourth embodiment can output a signal in which the quantization noise near the intended wave frequency is reduced. Therefore, the data converter section can provide similar effects to those of the first embodiment. Moreover, in the transmitter circuit of the present embodiment, a signal in which the quantization noise near the intended wave frequency has been removed is inputted to the amplitude modulator section 19 and to the bandpass filter 16, thereby providing similar effects to those of the first embodiment.

Fifth Embodiment

Figure 30:
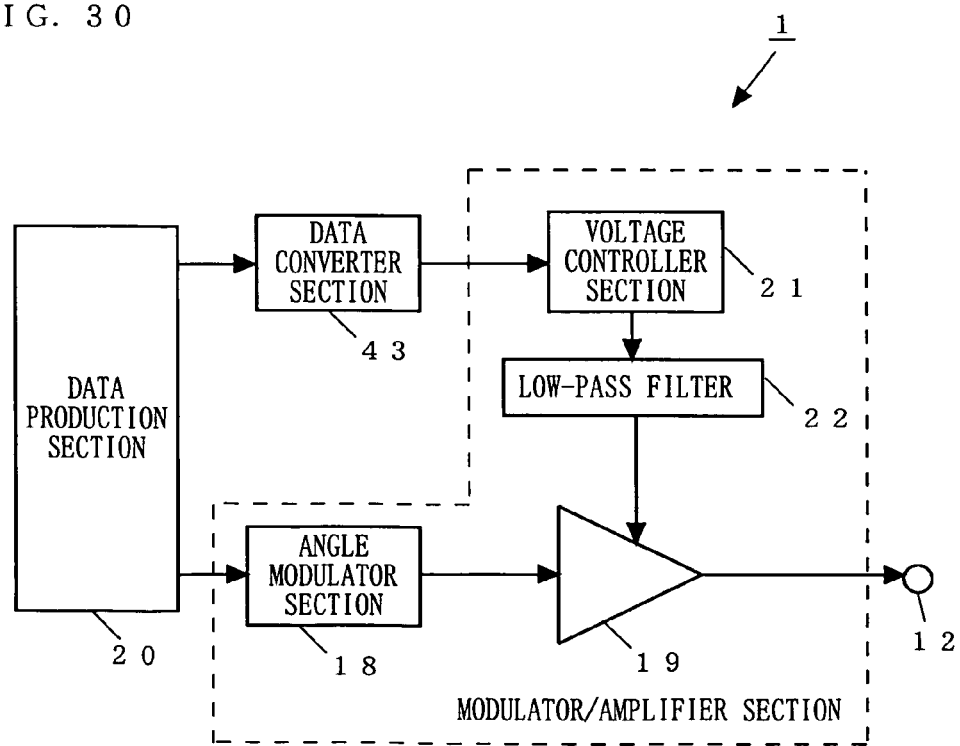
FIG. 30 is a block diagram showing an exemplary configuration of the transmitter circuit 1 according to a fifth embodiment of the present invention.

FIG. 30 is a block diagram showing an exemplary configuration of the transmitter circuit 1 according to a fifth embodiment of the present invention. The transmitter circuit 1 of the present embodiment differs from the transmitter circuit 1 of the fourth embodiment (FIG. 29) in that the output signal from the data converter section 43 is inputted to the amplitude modulator 19 via a low-pass filter 22. Note that the data converter section 43 of the present embodiment is similar to that of the fourth embodiment.

Referring to FIG. 30, the transmitter circuit 1 includes the output terminal 12, the data converter section 43, the angle modulator section 18, the amplitude modulator section 19, the data production section 20, the voltage controller section 21 and the low-pass filter 22.

The low-pass filter 22 removes noise components from the voltage outputted from the voltage controller section 21. The data production section 20, the data converter section 43, the angle modulator section 18, the amplitude modulator section 19 and the voltage controller section 21 are similar in configuration to those of the fourth embodiment. The angle modulator section 18, the amplitude modulator section 19, the voltage controller section 21 and the low-pass filter 22 together form a modulator/amplifier section.

The operation of the transmitter circuit 1 will now be described.

The transmitter circuit 1 operates as does the transmitter circuit 1 of the fourth embodiment (FIG. 29) up to the point where the data converter section 43 and the angle modulator section 18 give output signals.

The output signal from the data converter section 43 is inputted to the voltage controller section 21. The voltage controller section 21 supplies a voltage according to the output signal from the data converter section 43 to the amplitude modulator section 19 via the low-pass filter 22. The voltage controller section 21 may be, for example, an amplifier having a high efficiency. Then, the voltage controller section 21 outputs an amplified amplitude data as the output voltage.

The low-pass filter 22 removes out-of-band, unnecessary quantization noise components from the voltage supplied from the voltage controller section 21 to the amplitude modulator section 19. Thus, a voltage from which quantization noise has been removed is applied to the amplitude modulator section 19. The low-pass filter 22 is not required to have steep attenuation characteristics because quantization noise has already been removed by the data converter section 43.

The angle-modulated wave signal from the angle modulator section 18 is inputted to the amplitude modulator section 19. The amplitude modulator section 19 amplitude-modulates the angle-modulated wave signal with the voltage that is received via the low-pass filter 22 to output a modulated wave signal. Thus, an intended modulated wave signal is outputted from the output terminal 12.

As described above, the data converter section of the fifth embodiment can output a signal in which the quantization noise near the intended wave frequency is reduced. Therefore, the data converter section can provide similar effects to those of the first embodiment. Moreover, in the transmitter circuit of the present embodiment, a signal in which the quantization noise near the intended wave frequency has been removed is inputted to the voltage controller section 21, to the low-pass filter 22 and to the amplitude modulator section 19, thereby providing similar effects to those of the first embodiment.

Sixth Embodiment

Figure 31:
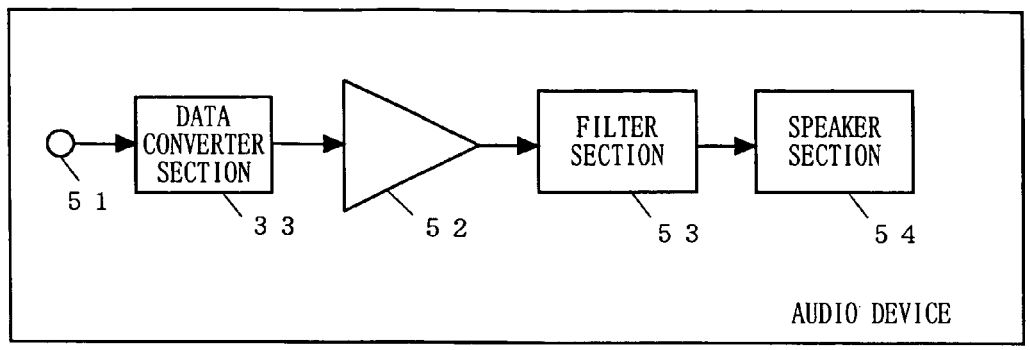
FIG. 31 is a block diagram showing an exemplary configuration of an audio device using the data converter section 33 of the present invention.

A sixth embodiment of the present invention is directed to an electronic device such as an audio device or a video device using the data converter section 33 of the third embodiment. FIG. 31 is a block diagram showing an exemplary configuration of an audio device using the data converter section 33 of the present invention. Referring to FIG. 31, the audio device includes a terminal 51, the data converter section 33, an amplifier 52, a filter section 53 and a speaker section 54.

Referring to FIG. 31, an input signal, being audio data, is inputted to the data converter section 33 via the terminal 51. As in the third embodiment, the data converter section 33 discretizes the input signal, being audio data, to obtain a signal having a lower resolution magnitude-wise than that of the input signal. Then, the data converter section 33 removes quantization noise near the intended wave frequency from the signal having a lower resolution magnitude-wise to output a signal in which the quantization noise has been removed. The amplifier 52 amplifies the output signal from the data converter section 33. The signal amplified through the amplifier 52 is passed through the filter section 53 to the speaker section 54, where it is converted to sound. The filter section 53 may be a low-pass filter if the delta-sigma modulator of the data converter section 33 (see FIG. 24) is of a low-pass type, and may be a bandpass filter if the delta-sigma modulator is of a band-pass type. Thus, it is possible to provide an audio device with suppressed quantization noise and reduced power consumption.

Figure 32:
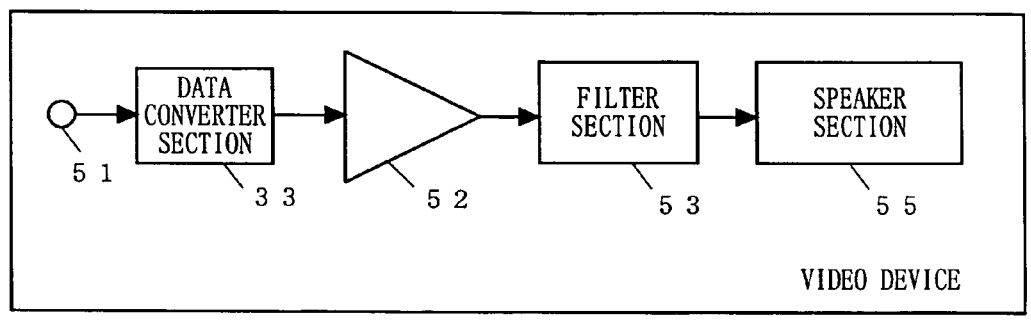
FIG. 32 is a block diagram showing an exemplary configuration of a video device using the data converter section 33 of the present invention.
Figure 33:
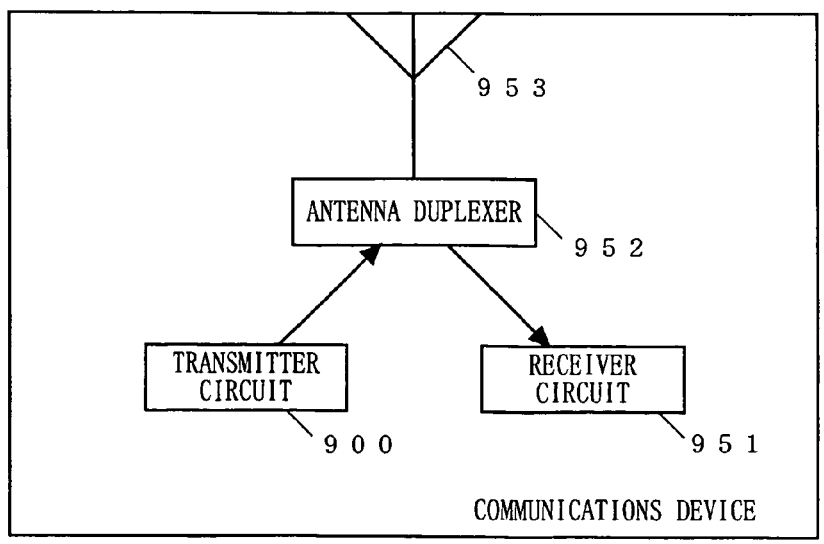
FIG. 33 is a block diagram showing an exemplary configuration of a conventional communications device.
Figure 34:
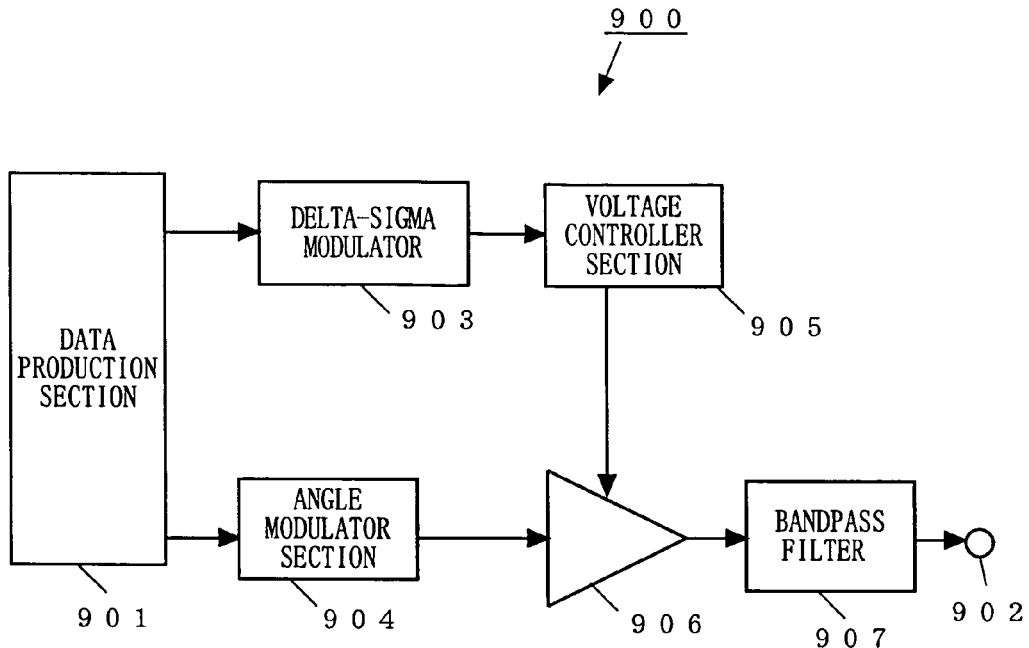
FIG. 34 is a block diagram showing an exemplary configuration of a conventional transmitter circuit 900.
Figure 35:
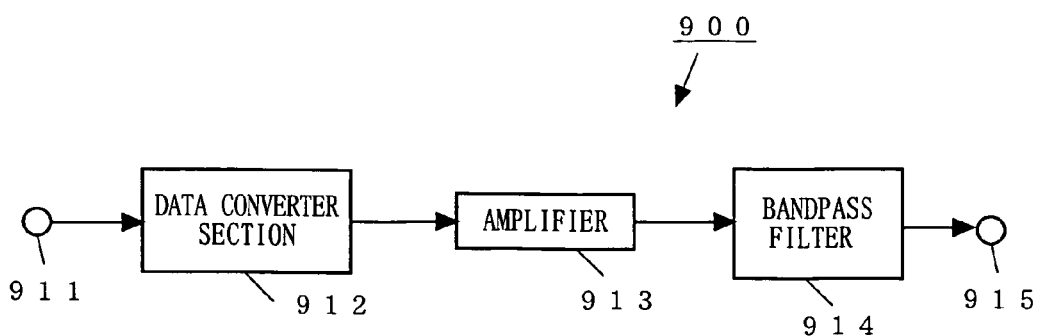
FIG. 35 is a block diagram showing an exemplary configuration of the conventional transmitter circuit 900.
Figure 36:
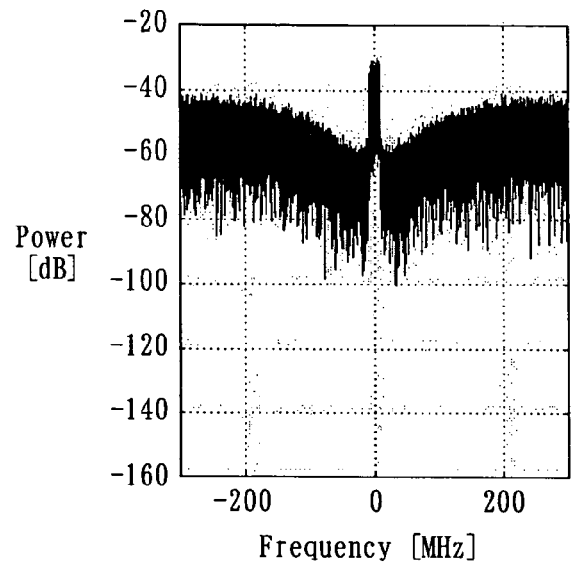
FIG. 36 shows an exemplary waveform of a modulated wave signal from an amplitude modulation section 906.
Figure 37:
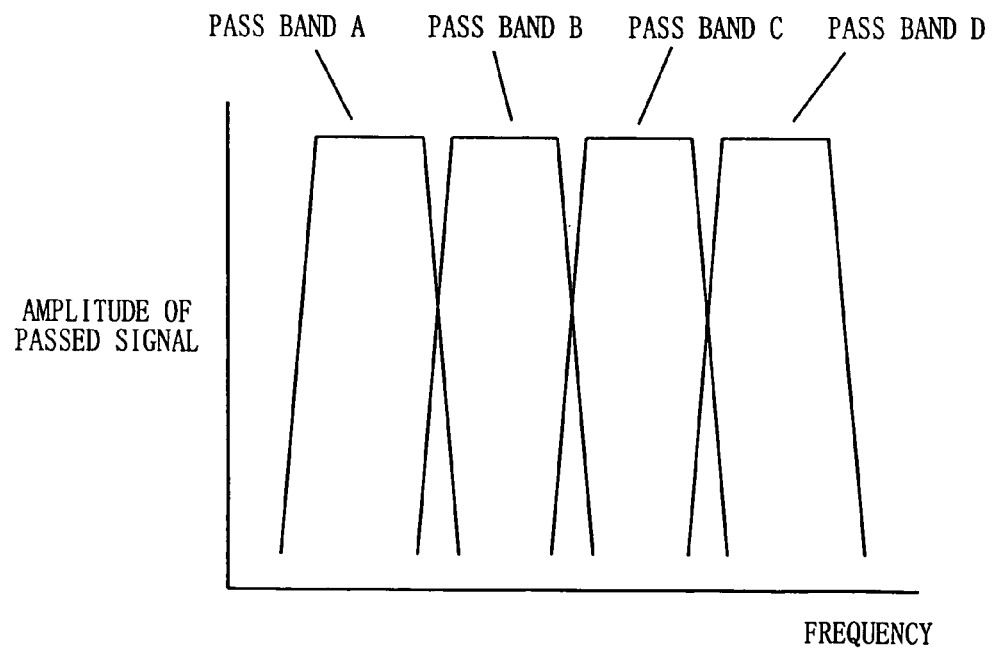
FIG. 37 shows exemplary characteristics required for a bandpass filter 907 in a conventional transmitter circuit.
Figure 38:
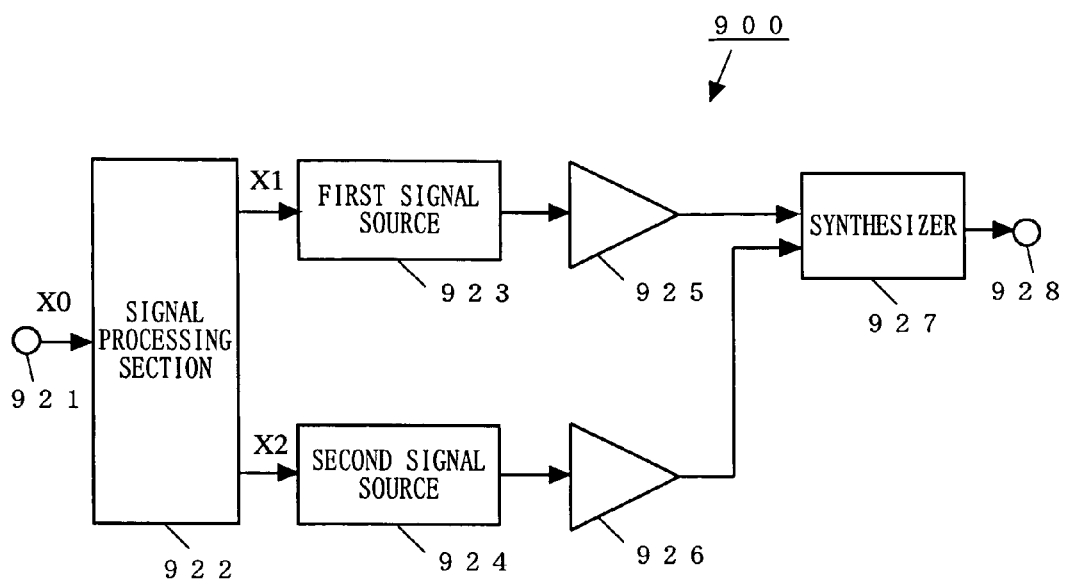
FIG. 38 is a block diagram showing an exemplary configuration of the conventional transmitter circuit 900.

FIG. 32 is a block diagram showing an exemplary configuration of a video device using the data converter section 33 of the present invention. Referring to FIG. 32, the video device includes the terminal 51, the data converter section 33, the amplifier 52, the filter section 53 and a display section 55.

Referring to FIG. 32, an input signal, being video data, is inputted to the data converter section 33 via the terminal 51. As in the third embodiment, the data converter section 33 discretizes the input signal, being video data, to obtain a signal having a lower resolution magnitude-wise than that of the input signal. Then, the data converter section 33 removes quantization noise near the intended wave frequency from the signal having a lower resolution magnitude-wise to output a signal in which the quantization noise has been removed. The amplifier 52 amplifies the output signal from the data converter section 33. The signal amplified through the amplifier 52 is passed through the filter section 53 to the display section 55, where it is converted to a video image and/or sound. Thus, it is possible to provide a video device with suppressed quantization noise and reduced power consumption.

The data converter section 33 of the present invention may be used in any electronic device that uses an amplifier, and the applications thereof are not limited to communications devices, audio devices and video devices.

With the data converter of the present invention, it is possible to suppress the quantization noise and to reduce the power consumption, and the data converter of the present invention can be used in various applications, including communications devices such as mobile telephones and wireless LAN devices, and other electronic devices such as audio devices and video devices.

While the invention has been described in detail, the foregoing description is in all aspects illustrative and not restrictive. It is understood that numerous other modifications and variations can be devised without departing from the scope of the invention.

What is claimed is:

1. A data converter device for performing a predetermined data conversion operation on a discretized input signal which is quadrature data to output a discretized output signal, the data converter device comprising:
    a first operational section for increasing a discrete value interval between amplitude components of the input signal to produce an output signal having a lower resolution amplitude-component-wise than that of the input signal;
    a second operational section for subtracting the input signal from the output signal having a lower resolution produced by the first operational section to extract quantization noise components generated in the first operational section;
    a third operational section that includes a filter for extracting, from the quantization noise components extracted by the second operational section, quantization noise components near an intended wave frequency being a center frequency, with a predetermined cutoff frequency; and
    a fourth operational section for outputting, based on the output signal having a lower resolution produced by the first operational section and the quantization noise components near the intended wave frequency extracted by the third operational section, a signal obtained by removing the quantization noise components near the intended wave frequency from the signal having a lower resolution amplitude-component-wise than that of the input signal,
    wherein the filter is a low-pass filter if a zero point of a noise transfer function of the first operational section is 1, and the filter is a bandpass filter if a zero point of the noise transfer function of the first operational section is a complex number whose magnitude is 1, and
    wherein the predetermined cutoff frequency of the third operational section is decided such that a fluctuation level of a complex envelope of the signal outputted by the fourth operational section is equal to or less than a predetermined value.

2. The data converter device according to claim 1, wherein:
the input signal is quadrature data; and
the first operational section includes:
    a coordinate converter section for producing amplitude data representing a magnitude of the quadrature data and dividing the quadrature data by the amplitude data to produce phase data, thereby performing a coordinate conversion operation converting the quadrature data to the amplitude data and the phase data;
    a delta-sigma modulator for delta-sigma-modulating the amplitude data into two or more values, thereby lowering a resolution of the amplitude data; and
    a multiplier section for multiplying the amplitude data delta-sigma-modulated by the delta-sigma modulator with the phase data to output a signal having a lower resolution magnitude-wise than that of the quadrature data.

3. The data converter device according to claim 1, wherein:
the input signal is quadrature data;
the first operational section includes:
    at least one subtractor section receiving the quadrature data;
    at least one vector integrator section connected to the subtractor section for integrating together elements of the quadrature data; and
    a vector quantizer section for quantizing the quadrature data, which has been integrated by the vector integrator section, so that a magnitude of the integrated quadrature data is equal to a maximum discrete value among at least two discrete values that is smaller than a magnitude of the received quadrature data and so that a phase of the integrated quadrature data is equal to that of the received quadrature data, thereby outputting a signal having a lower resolution magnitude-wise than that of the received quadrature data; and
the subtractor section subtracts the quadrature data, which has been obtained through quantization by the vector quantizer section, from the received quadrature data.

4. The data converter device according to claim 1, wherein:
the input received signal is a modulated wave signal obtained through a modulation operation based on quadrature data; and
the first operational section includes a delta-sigma modulator for delta-sigma-modulating the modulated wave signal into two or more values to output a signal having a lower resolution magnitude-wise than that of the modulated wave signal.

5. The data converter device according to claim 1, wherein the cutoff frequency of the filter is smaller than ½ a sampling frequency in the first operational section if the filter is a low-pass filter, and the cutoff frequency of the third operational section is larger than the center frequency of the received signal minus ½ the sampling frequency in the first operational section and smaller than the center frequency of the received signal plus ½ the sampling frequency if the filter is a bandpass filter.

6. A transmitter circuit for performing a predetermined operation on an input signal to output a signal to be transmitted, the transmitter circuit comprising:
 a data converter section for receiving a whole or a part of the input signal and performing a predetermined data conversion operation on the received signal;
 a modulator/amplifier section for performing at least one of a modulation operation and an amplification operation based on the signal converted by the data converter section; and
 a bandpass filter for removing out-of-band, unnecessary components from the signal, which has undergone at least one of the modulation operation and the amplification operation by the modulator/amplifier section, with a predetermined cutoff frequency to output the signal to be transmitted;
 wherein the data converter section is the data converter device according to claim 1.

7. The transmitter circuit according to claim 6, wherein:
 the input signal is quadrature data;
 the data converter section receives quadrature data; and
 the modulator/amplifier section includes:
  a vector modulator section for modulating a signal converted by the data converter section; and
  an amplifier section for amplifying the signal modulated by the vector modulator section to a predetermined output level.

8. The transmitter circuit according to claim 7, wherein the modulation operation performed by the vector modulator section is a quadrature modulation operation.

9. The transmitter circuit according to claim 6, wherein:
 the input signal is quadrature data;
 the data converter section receives quadrature data; and
 the modulator/amplifier section includes:
  a polar coordinate system converter section for converting the signal converted by the data converter section to polar coordinate data to output amplitude data and phase data;
  an angle modulator section for angle-modulating the phase data to output an angle-modulated wave signal;
  an amplitude modulator section for amplitude-modulating the angle-modulated wave signal with a voltage according to a magnitude of the amplitude data; and
  a voltage controller section for controlling the voltage supplied to the amplitude modulator section according to the magnitude of the amplitude data.

10. The transmitter circuit according to claim 6, wherein:
 the input signal is a modulated wave signal obtained through a modulation operation based on quadrature data;
 the data converter section receives the modulated wave signal; and
 the modulator/amplifier section includes an amplifier section for amplifying the signal converted by the data converter section to a predetermined output level.

11. The transmitter circuit according to claim 6, wherein:
 the input signal is polar coordinate data including amplitude data and phase data;
 the data converter section receives the amplitude data; and
 the modulator/amplifier section includes:
  an angle modulator section for angle-modulating the phase data to output an angle-modulated wave signal;
  an amplitude modulator section for amplitude-modulating the angle-modulated wave signal with a voltage according to a magnitude of a signal outputted from the data converter section; and
  a voltage controller section for controlling the voltage supplied to the amplitude modulator section according to the magnitude of the signal outputted from the data converter section.

12. A transmitter circuit for performing a predetermined operation on an input signal to output a signal to be transmitted, the transmitter circuit comprising:
 a data converter section for receiving a whole or a part of the input signal and performing a predetermined data conversion operation on the received signal; and
 a modulator/amplifier section for performing at least one of a modulation operation and an amplification operation based on the signal converted by the data converter section,
 wherein the data converter section is the data converter device according to claim 1.

13. The transmitter circuit according to claim 12, wherein:
 the input signal is polar coordinate data including amplitude data and phase data;
 the data converter section receives the amplitude data; and
 the modulator/amplifier section includes:
  a voltage controller section for controlling an output voltage according to the signal converted by the data converter section;
  a low-pass filter for rejecting the voltage controlled by the voltage controller section with a predetermined cutoff frequency to remove out-of-band noise components;
  an angle modulator section for angle-modulating the phase data to output an angle-modulated wave signal; and
  an amplitude modulator section for amplitude-modulating the angle-modulated wave signal with the voltage outputted from the low-pass filter.

14. The transmitter circuit according to claim 7, wherein the first operational section includes:
 a coordinate converter section for producing amplitude data representing a magnitude of the quadrature data and dividing the quadrature data by the amplitude data to produce phase data, thereby performing a coordinate conversion operation converting the quadrature data to the amplitude data and the phase data;
 a delta-sigma modulator for delta-sigma-modulating the amplitude data into two or more values, thereby lowering a resolution of the amplitude data; and
 a multiplier section for multiplying the amplitude data delta-sigma-modulated by the delta-sigma modulator with the phase data to output a signal having a lower resolution magnitude-wise than that of the quadrature data.

15. The transmitter circuit according to claim 9, wherein the first operational section includes:
 a coordinate converter section for producing amplitude data representing a magnitude of the quadrature data and dividing the quadrature data by the amplitude data to produce phase data, thereby performing a coordinate conversion operation converting the quadrature data to the amplitude data and the phase data;
 a delta-sigma modulator for delta-sigma-modulating the amplitude data into two or more values, thereby lowering a resolution of the amplitude data; and
 a multiplier section for multiplying the amplitude data delta-sigma-modulated by the delta-sigma modulator with the phase data to output a signal having a lower resolution magnitude-wise than that of the quadrature data.

16. The transmitter circuit according to claim 7, wherein: the first operational section includes:
   at least one subtractor section receiving the quadrature data;
   at least one vector integrator section connected to the subtractor section for integrating together elements of the quadrature data; and
   a vector quantizer section for quantizing the quadrature data, which has been integrated by the vector integrator section, so that a magnitude of the integrated quadrature data is equal to a maximum discrete value among at least two discrete values that is smaller than a magnitude of the received quadrature data and so that a phase of the integrated quadrature data is equal to that of the received quadrature data, thereby outputting a signal having a lower resolution magnitude-wise than that of the received quadrature data; and
   the subtractor section subtracts the quadrature data, which has been obtained through quantization by the vector quantizer section, from the received quadrature data.

17. The transmitter circuit according to claim 9, wherein: the first operational section includes:
   at least one subtractor section receiving the quadrature data;
   at least one vector integrator section connected to the subtractor section for integrating together elements of the quadrature data; and
   a vector quantizer section for quantizing the quadrature data, which has been integrated by the vector integrator section, so that a magnitude of the integrated quadrature data is equal to a maximum discrete value among at least two discrete values that is smaller than a magnitude of the received quadrature data and so that a phase of the integrated quadrature data is equal to that of the received quadrature data, thereby outputting a signal having a lower resolution magnitude-wise than that of the received quadrature data; and
   the subtractor section subtracts the quadrature data, which has been obtained through quantization by the vector quantizer section, from the received quadrature data.

18. The transmitter circuit according to claim 10, wherein the first operational section includes a delta-sigma modulator for delta-sigma-modulating the received signal into two or more values to output a signal having a lower resolution magnitude-wise than that of the received signal.

19. The transmitter circuit according to claim 11, wherein the first operational section includes a delta-sigma modulator for delta-sigma-modulating the received signal into two or more values to output a signal having a lower resolution magnitude-wise than that of the received signal.

20. The transmitter circuit according to claim 6, wherein the cutoff frequency of the filter is smaller than $\frac{1}{2}$ a sampling frequency in the first operational section if the filter is a low-pass filter, and the cutoff frequency of the third operational section is larger than the center frequency of the received signal minus $\frac{1}{2}$ the sampling frequency in the first operational section and smaller than the center frequency of the received signal plus $\frac{1}{2}$ the sampling frequency if the filter is a bandpass filter.

21. The transmitter circuit according to claim 12, wherein the cutoff frequency of the filter is smaller than $\frac{1}{2}$ a sampling frequency in the first operational section if the filter is a low-pass filter, and the cutoff frequency of the third operational section is larger than the center frequency of the received signal minus $\frac{1}{2}$ the sampling frequency in the first operational section and smaller than the center frequency of the received signal plus $\frac{1}{2}$ the sampling frequency if the filter is a bandpass filter.

22. A communications device, comprising:
   a transmitter circuit for producing a signal to be transmitted; and
   an antenna for outputting the transmitted signal produced by the transmitter circuit,
   wherein the transmitter circuit is the transmitter circuit according to claim 6.

23. A communications device, comprising:
   a transmitter circuit for producing a signal to be transmitted; and
   an antenna for outputting the transmitted signal produced by the transmitter circuit,
   wherein the transmitter circuit is the transmitter circuit according to claim 12.

24. An electronic device, comprising:
   an amplifier; and
   a data converter section for converting an input signal to a signal to be inputted to the amplifier,
   wherein the data converter section is the data converter device according to claim 1.

25. A data conversion method for performing a predetermined data conversion operation on a discretized input signal which is quadrature data to output a discretized output signal, the data conversion method comprising:
   a first step of increasing a discrete value interval between amplitude components of the input signal, using a first operational section, to produce an output signal having a lower resolution amplitude-component-wise than that of the input signal;
   a second step of subtracting the input signal from the output signal having a lower resolution produced in the first step to extract quantization noise components generated in first the step;
   a third step of rejecting the quantization noise components extracted in the second step by using a filter with a predetermined cutoff frequency to extract quantization noise components near an intended wave frequency being a center frequency of the input signal; and
   a fourth step of subtracting the quantization noise components near the intended wave frequency extracted in the third step from the output signal having a lower resolution produced in the first step to output a signal obtained by removing the quantization noise components near the intended wave frequency from the signal having a lower resolution amplitude-component-wise than that of the input signal,
   wherein the filter is a low-pass filter if a zero point of a noise transfer function of the first operational section is 1, and the filter is a bandpass filter if a zero point of the noise transfer function of the first operational section is a complex number whose magnitude is 1, and
   wherein the predetermined cutoff frequency is decided such that a fluctuation level of a complex envelope of the signal output in said fourth step is equal to or less than a predetermined value.

26. The data conversion method according to claim 25, wherein the cutoff frequency of the filter is smaller than $\frac{1}{2}$ a sampling frequency in the first step if the filter is a low-pass filter, and the cutoff frequency of the filter is larger than the center frequency of the received signal minus $\frac{1}{2}$ the sampling frequency in the first step and smaller than the center frequency of the received signal plus $\frac{1}{2}$ the sampling frequency if the filter is a bandpass filter.

* * * * *